United States Patent [19]
Hamamoto et al.

[11] Patent Number: 5,130,945
[45] Date of Patent: Jul. 14, 1992

[54] CONTENT ADDRESSABLE MEMORY COMBINING MATCH COMPARISONS OF A PLURALITY OF CELLS

[75] Inventors: Takeshi Hamamoto; Toshifumi Kobayashi; Masaaki Mihara, all of Hyogo, Japan

[73] Assignee: Mitsubishi Denki Kabushiki Kaisha, Tokyo, Japan

[21] Appl. No.: 551,268

[22] Filed: Jul. 12, 1990

[30] Foreign Application Priority Data

Jul. 14, 1989 [JP] Japan .................................. 1-183222

[51] Int. Cl.$^5$ .............................................. G11C 13/00
[52] U.S. Cl. .......................................... 365/49; 365/45
[58] Field of Search ..................... 365/49, 45, 189.01

[56] References Cited
U.S. PATENT DOCUMENTS

| | | | |
|---|---|---|---|
| 3,868,642 | 2/1975 | Sachs | 365/49 |
| 4,084,260 | 4/1978 | Fleming et al. | 365/49 |
| 4,385,371 | 5/1983 | Shafer et al. | 365/49 |

Primary Examiner—Terrell W. Fears
Attorney, Agent, or Firm—Lowe, Price, LeBlanc & Becker

[57] ABSTRACT

Each match line is connected to a plurality of CAM cells constituting a CAM array. The respective CAM cells store data applied through a bit line and an inverted-bit line in its data storage portion when selected by a word line. The stored data are applied to a data comparison portion to be compared with retrieval data applied through the bit line and the inverted-bit line, thereby detecting match or mismatch therebetween. A comparison result of the data comparison portion is first stored in a capacitance element in the form of charge. In order to prevent escape of the information stored in the capacitance element, a blocking means blocks a part of a charge and discharge path for the capacitance element. A charge transfer means provided between the capacitance element and the match line transfers a certain amount of charge from either one to the other when information of mismatch is stored in the capacitance element. This causes fluctuation of charge potential on the match line. The fluctuation of potential on the match line depends on the number of mismatched CAM cells out of a plurality of CAM cells connected to the match line. Therefore, detection of potential on the match line permits detecting the number of mismatched CAM cells.

13 Claims, 23 Drawing Sheets

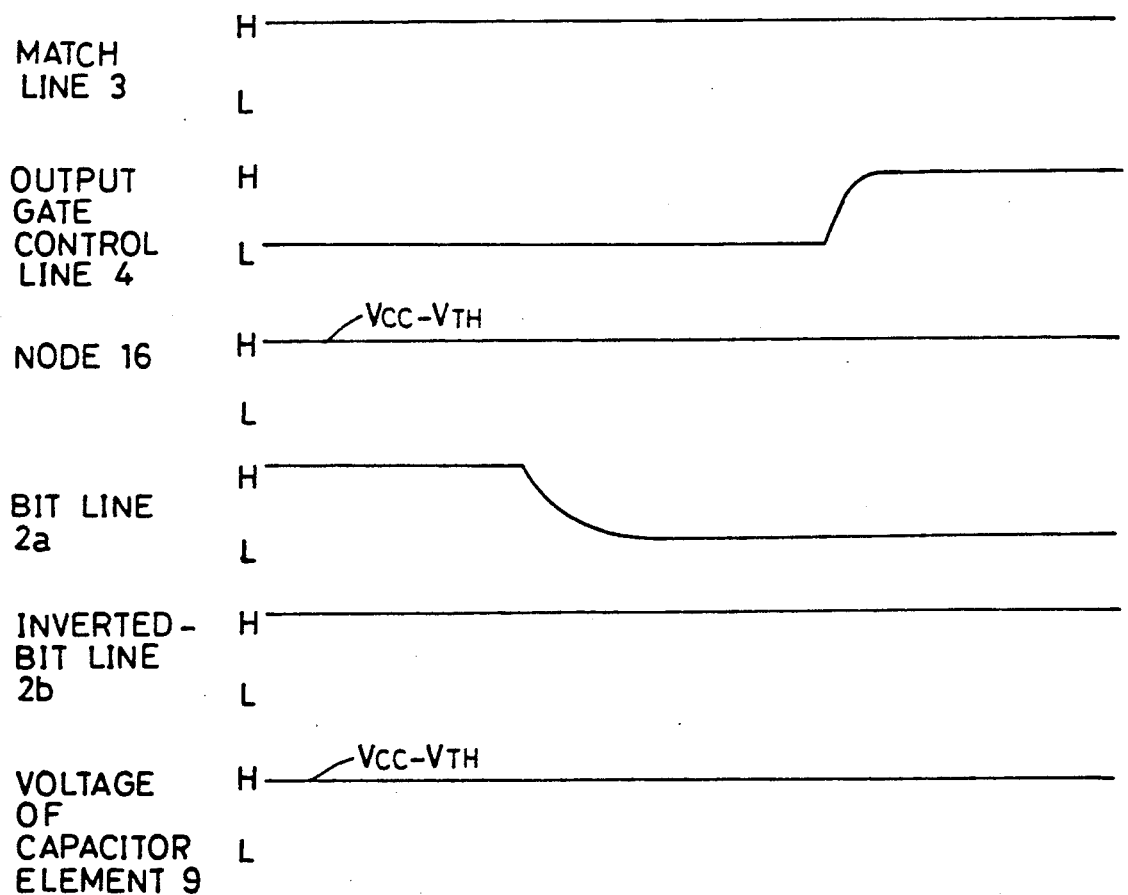

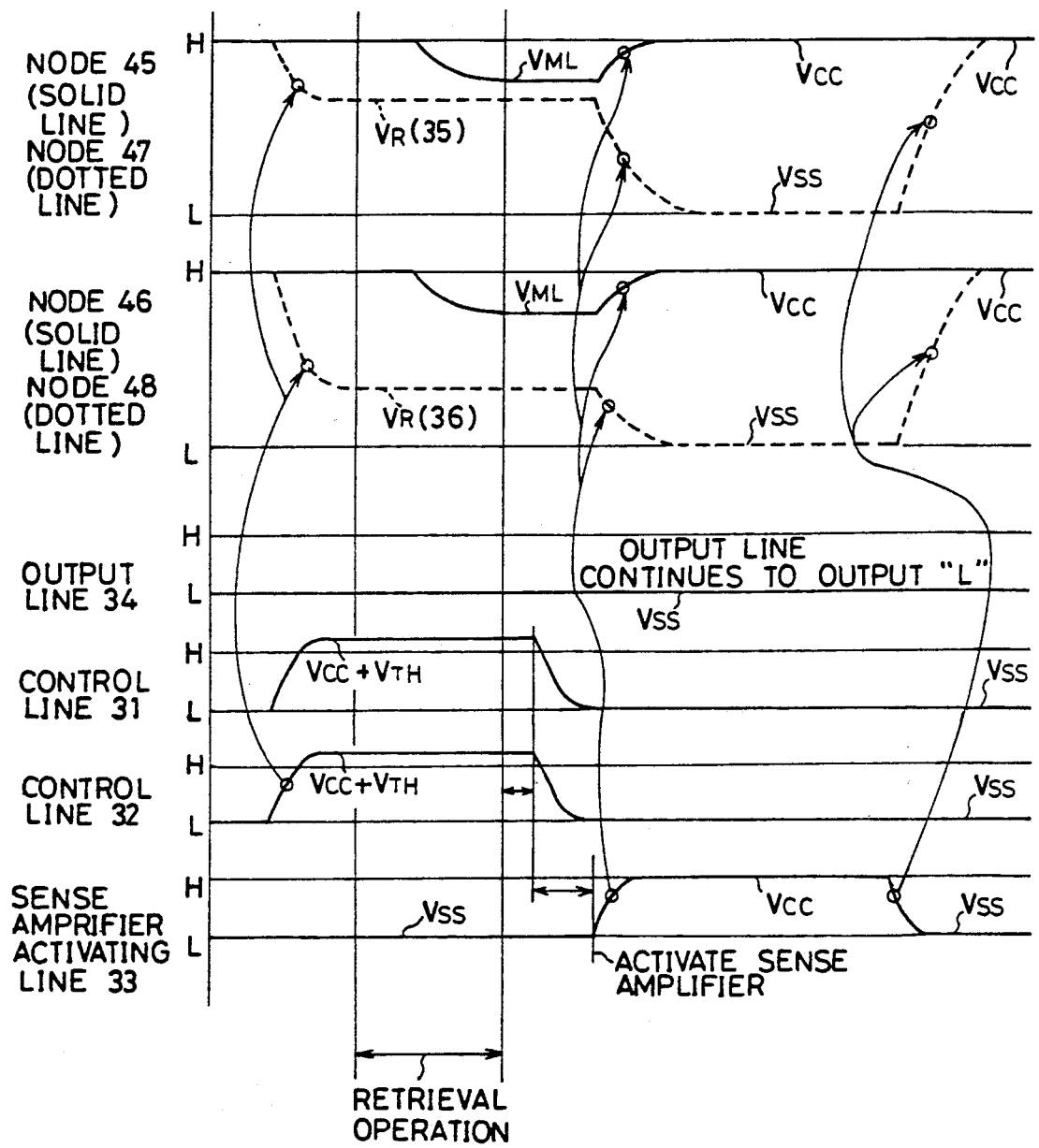

CONTENT ADDRESSABLE MEMORY COMBINING MATCH COMPARISONS OF A PLURALITY OF CELLS

BACKGROUND OF THE INVENTION

1. Field of the Invention

The present invention generally relates to content-address memory cells (referred to simply as CAM cell hereinafter), and more particularly, to a content-address memory cell which stores data and has a bit matching function to detect match or mismatch between the stored data and retrieval data for output.

2. Description of the Prior Art

FIG. 1 is a circuit diagram showing a conventional CAM cell as disclosed in "IEEE Journal of Solid-State Circuits, Vol. SC—7, pp. 366" (U.S. Pat. No. 3,701,980). In the diagram, a CAM cell 6 is connected to a word line 1, a bit line 2a, an inverted-bit line 2b and a match line 3. The CAM cell 6 comprises a data storage portion 7, a data comparison portion 8 and an n-channel MOS transistor 10. The data storage portion 7 comprises two n-channel MOS transistors 13a and 13b, and the data comparison portion 8 comprises two n-channel MOS transistors 14a and 14b. The n-channel MOS transistor 13a is connected between the bit line 2a and the gate of the n-channel MOS transistor 14a, and the n-channel MOS transistor 13b is connected between the inverted-bit line 2b and the gate of the n-channel MOS transistor 14b. Further, the respective gates of these n-channel MOS transistors 13a and 13b are both connected to the word line 1. The n-channel MOS transistor 14a is connected between the bit line 2a and a control terminal 16, and the n-channel MOS transistor 14b is connected between the inverted-bit line 2b and the control terminal 16. Further, the n-channel MOS transistor 10 is connected between the match line 3 and the control terminal 16 and has the gate connected also to the match line 3. Therefore, the n-channel MOS transistor 10 serves as a diode. Meanwhile, the match line 3 has parasitic capacitance (capacitance value $C_M$).

In the following, operation of the conventional CAM cell shown in FIG. 1 will be described for the respective cases of writing, matching and reading, with reference to FIGS. 2 to 4.

WRITING OPERATION

Writing operation is performed, as shown in FIG. 2, by applying data to be written in to the bit line 2a and its inverted data to the inverted-bit line 2b, respectively, raising the word line 1 to the "H" level and then turning down the same to the "L" level again.

For example, in a case where a "H" level is applied to the bit line 2a as data to be written in and a "L" level is applied to the inverted-bit line 2b, the data "H" on the bit line 2a is stored in the gate capacitance of the n-channel MOS transistor 14a through the n-channel MOS transistor 13a which is turned on upon gate input of the "H" level from the word line 1. Likewise, the data "L" on the inverted-bit line 2b is stored in the gate capacitance of the n-channel MOS transistor 14b through the n-channel MOS transistor 13b which is turned on also upon gate input of the "H" level from the word line 1.

BIT MATCHING OPERATION

Bit checking operation is performed, as shown in FIGS. 3A and 3B, by applying an "H" level to both of the bit line 2a and the inverted-bit line 2b, precharging the match line 3 to the "H" level and then applying retrieval data to the bit line 2a and its inverted data to the inverted-bit line 2b, respectively. If a mismatch is found between the stored data and the retrieval data, the match line 3 is discharged (FIG. 3A), while the same is not discharged (FIG. 3B) if a match is found therebetween.

Assume for example that the storage data is an "H" level so that the gate capacitance of the n-channel MOS transistor 14a has an "H" level stored and the gate capacitance of the n-channel MOS transistor 14b has an "L" level stored, respectively, and the n-channel MOS transistor 14a is in its on-state and the n-channel MOS transistor 14b is in its off-state. Under these assumptions, if an "H" level is applied as retrieval data to raise the bit line 2a to the "H" level and turn down the inverted-bit line 2b to the "L" level, then the control terminal 16 attains the "H" level s that match line 3 is not discharged (FIG. 3B).

On the other hand, with the storage data being an "H" level again, if an "L" level is applied as retrieval data to turn down the bit line 2a to the "L" level and raise inverted-bit line 2b to the "H" level, since the n-channel MOS transistor 14a has been in its on-state and the n-channel MOS transistor 14b has been in its off-state, the control terminal 16 then falls to the "L" level so that the match line 3 is discharged through a discharge path comprising the n-channel MOS transistors 10 and 14a and the bit line 2a (FIG. 3A).

In the same manner, with the storage data being an "L" level, when retrieval data of an "H" level is applied, the control terminal 16 falls to the "L" level so that the match line 3 is discharged through the discharge path comprising the n-channel MOS transistors 10 and 14b and the inverted-bit line 2b, and when retrieval data of an "L" level is applied, the control terminal 16 attains the "H" level so that match line 3 is not discharged.

Furthermore, when an "H" level is applied to both of the bit line 2a and the inverted-bit line 2b, the control terminal 16 attains the "H" level independently of the storage data value. This state represents a state where no matching is performed, or a masked state.

As described above, in the matching operation, the match line 3 is discharged when mismatch is found between the storage data and the retrieval data while the same is not discharged when match or mask exists.

READING OPERATION

Reading operation is performed, as shown in FIG. 4, by raising the match line 3 to the "H" level after discharging of the bit line 2a and the inverted-bit line 2b to the "L" level.

When the storage data is an "H" level, for example, since the n-channel MOS transistor 14a is in its on-state, potential on the bit line 2a is increased through the n-channel MOS transistors 10 and 14a by the rise of the match line 3 to the "H" level, which results in reading of the storage data "H".

Conversely, when the storage data is an "L" level, since the n-channel MOS transistor 14b is in its on-state, potential on the inverted-bit line 2b is increased through the n-channel MOS transistors 10 and 14b by the rise of the match line 3 to the "H" level, which results in reading of the storage data "L".

FIG. 5 is a circuit diagram showing another example of a conventional CAM cell. In the diagram, a CAM cell 6' is connected to a word line 1, a bit line 2a, an inverted-bit line 2b and a match line 3. The CAM cell 6 comprises a data storage portion 7' and a data comparison portion 8'. The data storage portion 7' comprises two n-channel MOS transistors 13a and 13b, and inverters 18a and 18b cross-coupled to each other, and the data comparison portion 8' comprises four n-channel MOS transistors 12a, 12b, 14a and 14b. The n-channel MOS transistor 13a has the source connected to the bit line 2a and the drain connected to the input terminal of the inverter 18b, the output terminal of the inverter 18a and the gate of the n-channel MOS transistor 14b. The n-channel MOS transistor 13b has the source connected to the inverted-bit line 2b and the drain connected to the output terminal of the inverter 18b, the input terminal of the inverter 18a and the gate of the n-channel MOS transistor 14a. Furthermore, the respective gates of these n-channel MOS transistors 13a and 13b are both connected to the word line 1. The gate of the n-channel MOS transistor 12a is connected to the bit line 2a and the gate of the n-channel MOS transistor 12b is connected to the inverted-bit line 2b, respectively. The n-channel MOS transistors 14a and 12a are connected in series between the match line 3 and a ground line 19. Likewise, the n-channel MOS transistors 14b and 12b are connected in series between the match line 3 and the ground line 19.

In the following, operation of the conventional CAM cell as shown in FIG. 5 will be described for the respective cases of writing, matching and reading.

WRITING OPERATION

Writing operation is performed by applying data to be written in to the bit line 2a and its inverted data to the inverted-bit line 2b, respectively, raising the word line 1 to the "H" level to latch the data in the cross-coupled inverters 18a and 18b, and subsequently turning down the word line 1 to the "L" level.

BIT MATCHING OPERATION

Bit checking operation is performed by applying an "L" level to both of the bit line 2a and the inverted-bit line 2b and precharging the match line 3 to the "H" level before applying retrieval data to the bit line 2a and its inverted data to the inverted-bit line 2b, respectively.

When match is found between the storage data and the retrieval data, since either of the n-channel MOS transistors 14a and 12a and either of the n-channel MOS transistors 14b and 12b do not fail to be turned off, the match line 3 is not discharged.

On the other hand, mismatch is found between the storage data and the retrieval data, since both of the n-channel MOS transistors 14a and 12a or both of the n-channel MOS transistors 14b and 12b do not fail to be turned on, the match line 3 is discharged by way of the n-channel MOS transistors 12a and 14a or the n-channel MOS transistors 12b and 14b through a discharge path of the ground line 19.

Furthermore, when an "L" level is applied to both of the bit line 2a and the inverted-bit line 2b, the match line 3 is not discharged irrespective of the storage data value. This state represents a state where matching is not performed, or a masked state.

As described in the above, in the matching operation, the match line 3 is discharged when mismatch is found between the storage data and the retrieval data while the same is not discharged when match or mask exists.

READING OPERATION

Reading operation is performed by equalizing the bit line 2a and the inverted-bit line 2b before raising the word line 1 to the "H" level. More specifically, when the word line is raised to the "H" level, the n-channel MOS transistors 13a and 13b are turned on so that the data latched in the cross-coupled inverters 18a and 18b is read out on the bit line 2a and the inverted-bit line 2b.

The CAM cell 6 shown in FIG. 1 is arranged in a matrix as shown in FIG. 6 to constitute a CAM array. Generally, in such a CAM array, matching operation covering the entire CAM array is performed at a time by applying retrieval data to a plurality of pairs of the bit line 2a and the inverted-bit line 2b. In this case, when mismatch is found in at least any one of a plurality of CAM cells 6 connected to a given one match line 3, the match line 3 is discharged. Therefore, only when match is found in all of the plurality of CAM cells 6 connected to a given one match line 3, the match line 3 remains held at a precharged level to be detected by a match detection circuit 20. Meanwhile, such a CAM array as described above is also constituted of the CAM cells 6' shown in FIG. 6 in the same manner.

The conventional CAM cells are constituted as described above so that in the matching operation, if any mismatch is found in at least one CAM cell 6 out of a plurality of CAM cells 6 connected to a single match line 3, the match line 3 is discharged from the "H" level to the "L" level. Therefore, retrieval is possible only where retrieval data and storage data completely match in the above plurality of CAM cells 6 in just a single matching operation, or where Hamming distance (number of mismatch between the retrieval data and the storage data) is "0". Furthermore, if the number of match lines 3 to be discharged in matching operation is large, consumption power for the matching operation is significantly increased.

The present invention has been made to solve such problems as described above and directed toward the object to provide a content-address memory cell which allows retrieval of storage data at any Hamming distance from retrieval data in only one matching operation, and reduction in consumption power for the matching operation as well.

The content-address memory cell according to the present invention stores data and detects match or mismatch between the stored data and retrieval data to output the results on a match line, comprising data storage means, data comparison means, a capacitance element, blocking means and charge transfer means. The data storage means stores data applied. The data comparison means compares the data stored in the data storage means with applied retrieval data to output the comparison results as to whether match or mismatch exists therebetween. The capacitance element stores the comparison results from the data comparison means. The blocking means blocks a part of a charge and discharge path for the above capacitance element storing the comparison results of the data comparison means. The charge transfer means forms a charge and discharge path between the capacitance element and the match line to transfer a certain amount of charges from either one to the other when the capacitance element stores mismatch of data as a comparison result of the data comparison means above.

According to the present invention, in data checking operation, the comparison means compares the data stored in the data storage means and retrieval data applied, the results of which are first stored in the capacitance element in the form of charges and then outputted on the match line. Therefore, if capacitance value of the capacitance element is set constant, potential level of the match line which have received the comparison results is determined depending on the number of mismatched content-address memory cells out of a plurality of content-address memory cells connected to the match line. Accordingly, detection of the potential level on the match line permits detecting the number of mismatched content-address memory cells.

As described above, according to the present invention, in matching operation the data comparison means compares the storage data in the data storage means with retrieval data applied, the results of which are first stored in the capacitance element in the form of changes before outputted on the match line. Therefore, when capacitance values of the capacitance elements in all the content-address memory cells are set constant, potential level on a single match line varies depending on the number of mismatched content-address memory cells out of a plurality of content-address memory cells connected to the match line so that detection of potential on the match line corresponding to a Hamming distance between the retrieval data and the storage data enables retrieval of the storage data at any Hamming distance from the retrieval data.

Additionally, according to the present invention, in matching operation a certain amount of charge is transferred only between the capacitance element and the match line to output the matching results on the match line and this reduces consumption power in the matching operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9, 10, 11A and 11B are waveform charts for explaining operation of the embodiment shown in FIG. 8.

FIGS. 14A to 14C are waveform charts for explaining operation of the match detection circuit shown in FIG. 13

DESCRIPTION OF THE PREFERRED EMBODIMENTS

Figure 7:
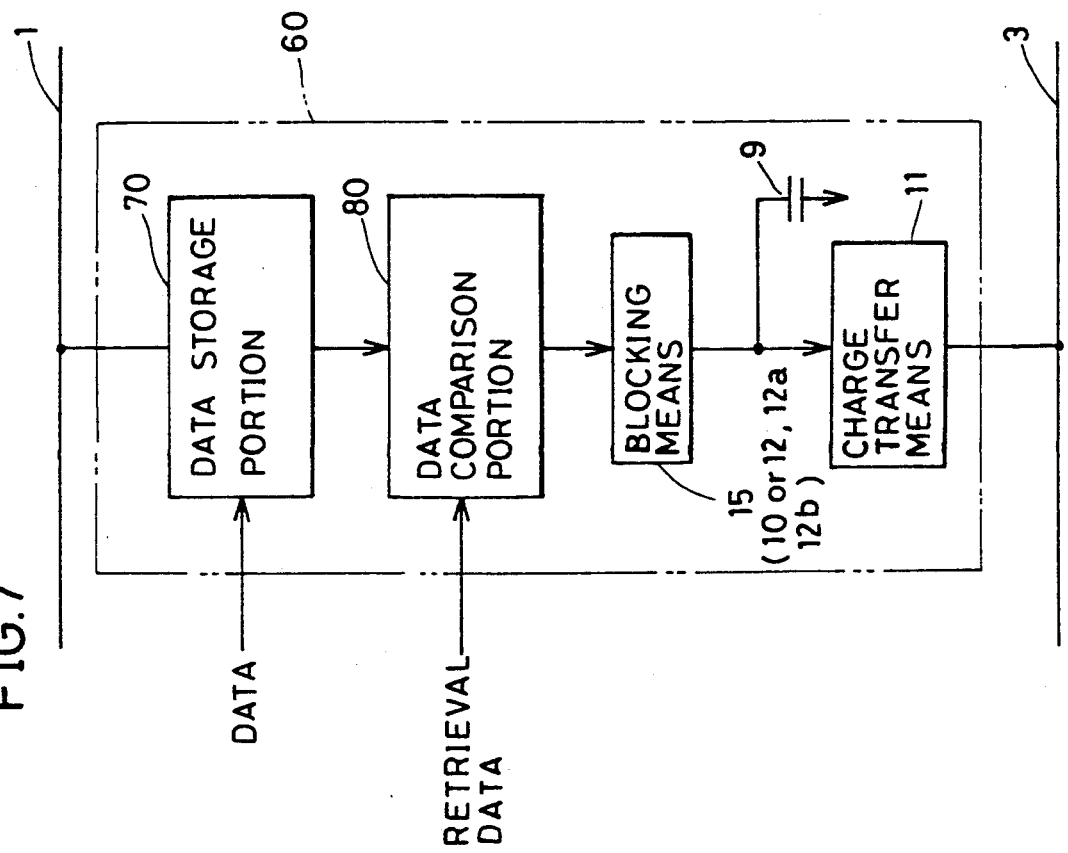
FIG. 7 is a block diagram showing conceptional structure of an embodiment according to the present invention.

Prior to describing specific circuit structures of embodiments according to the present invention, a conceptional structure of the embodiments will first be described with reference to FIG. 7. A CAM cell 60 comprises a data storage portion 70, a data comparison portion 80, blocking means 15, a capacitance element 9 and charge transfer means 11. The data storage portion 70 stores applied data when selected by a word line 1. The data comparison portion 80 compares the data stored in the data storage portion 70 with applied retrieval data to output match or mismatch therebetween as the comparison result. This comparison result is applied to the capacitance element 9 through the blocking means 15 to be stored therein in the form of charge. Once that comparison result is stored in the capacitance element 9, the blocking means 15 blocks a part of a charge and discharge path for the capacitance element 9 thereby to prevent the information charge stored in the capacitance element 9 from escaping through any line other than a match line 3. The charge transfer means 11 forms a charge and discharge path between the capacitance element 9 and the match line 3 when mismatch information is stored in the capacitance element 9. Furthermore, the charge transfer means 11 allows a certain amount of charge to transfer from either one to the other between the capacitance element 9 and the match line 3. This causes potential on the match line 3 to change by a certain amount under the influence of the capacitance element 9 having stored the mismatch information.

In the following, specific embodiments of the present invention will be further described with reference to drawings.

(1) First embodiment

Figure 8:
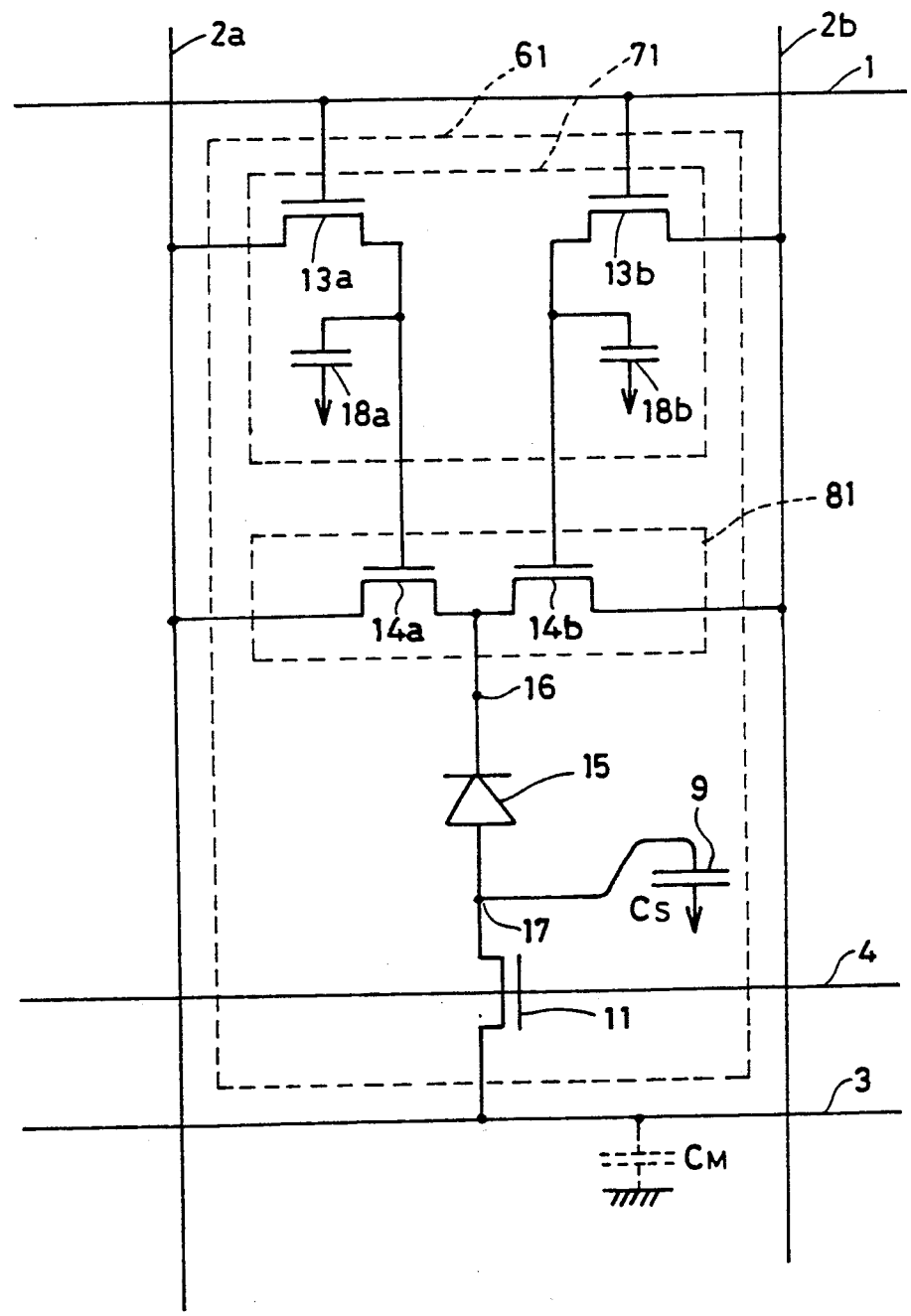
FIG. 8 is a circuit diagram showing structure of a first embodiment according to the present invention.

FIG. 8 is a circuit diagram showing a structure of a first embodiment according to the present invention. In the diagram, a CAM cell 61 is connected to a word line 1, a bit line 2a, an inverted-bit line 2b, a match line 3 and an output gate control line 4. The CAM cell 61 comprises a data storage portion 71, a data comparison portion 81, a diode 15, a capacitance element 9 and an output gate 11. The data storage portion 71 above comprises two n-channel MOS transistors 13a and 13b, and storage capacitance elements 18a and 18b. The data comparison portion 81 above comprises two n-channel MOS transistors 14a and 14b. The n-channel MOS transistor 13a has the gate connected to the word line 1, the source connected to the bit line 2a and the drain connected to the gate of the n-channel MOS transistor 14a and the storage capacitance element 18a. Furthermore, the n-channel MOS transistors 13b has the gate connected to the word line 1, the source connected to the inverted-bit line 2b and the drain connected to the gate of the n-channel MOS transistor 14b and the storage capacitance element 18b. Meanwhile, the n-channel MOS transistor 14a has the source connected to the bit line 2a and the drain connected to a first control terminal 16. The n-channel MOS transistor 14b has the source connected to the inverted-bit line 2b and the drain connected to the first control terminal 16. The diode 15 has the anode connected to a second control terminal 17 and the cathode to the first control terminal 16. The output gate 11 is constituted of an n-channel MOS transistor and connected between the match line 3 and the second control terminal 17. The gate of this n-channel MOS transistor 11 is connected to the output gate control line 4. Furthermore, the capacitance element 9 (capacitance value Cs) is connected to the second control terminal 17. Meanwhile, the match line 3 has parasitic capacitance (capacitance value $C_M$).

Figure 1:
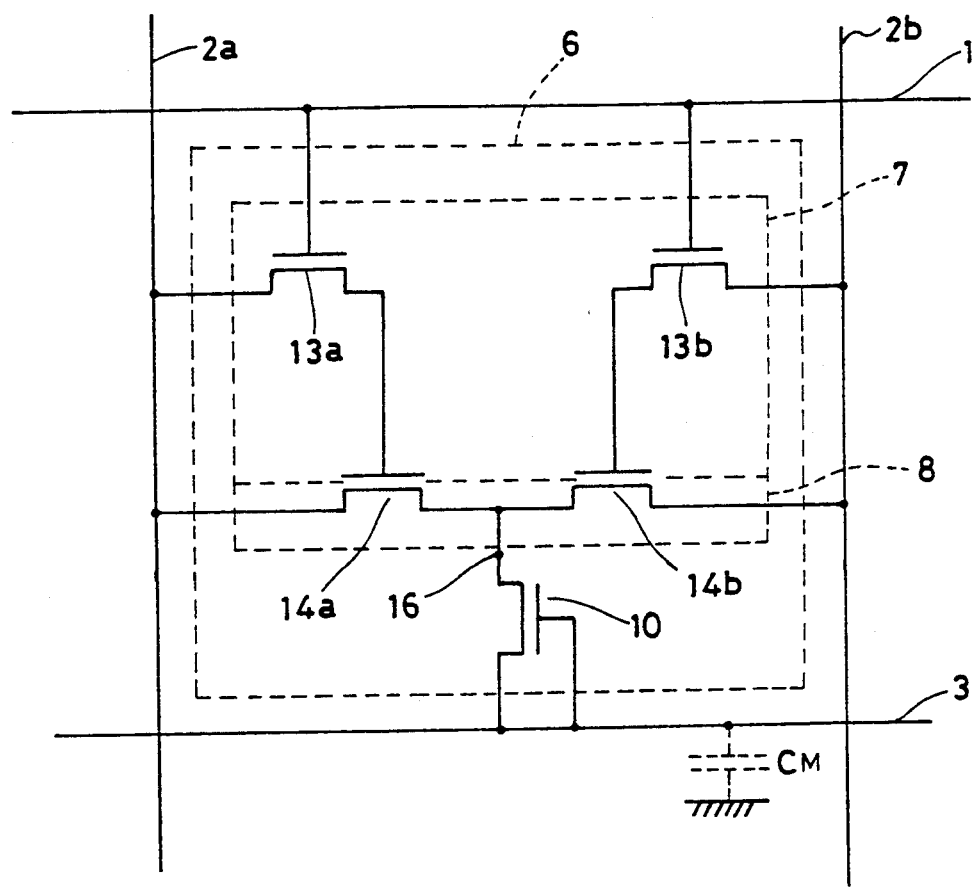
FIG. 1 is a circuit diagram showing an example of a conventional CAM cell.
Figure 2:
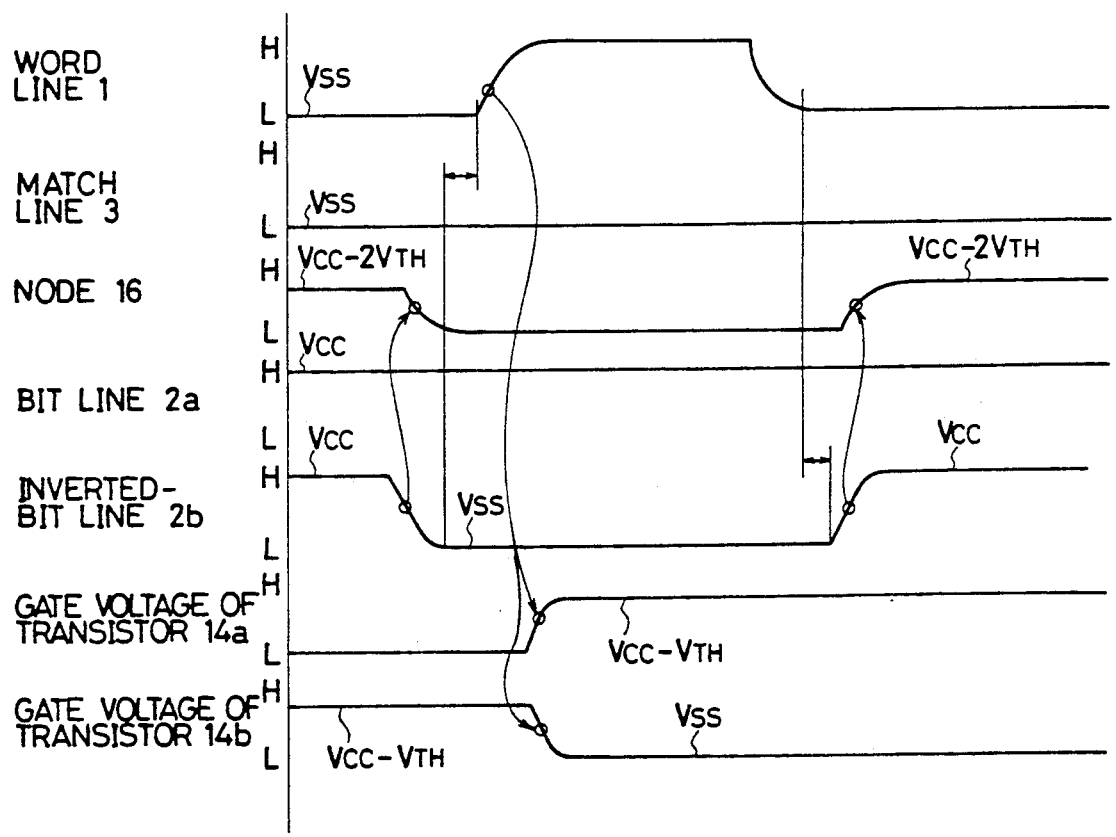
FIGS. 2, 3A, 3B and 4 are waveform charts for explaining operation of the CAM cell shown in FIG. 1.
Figure 3A:
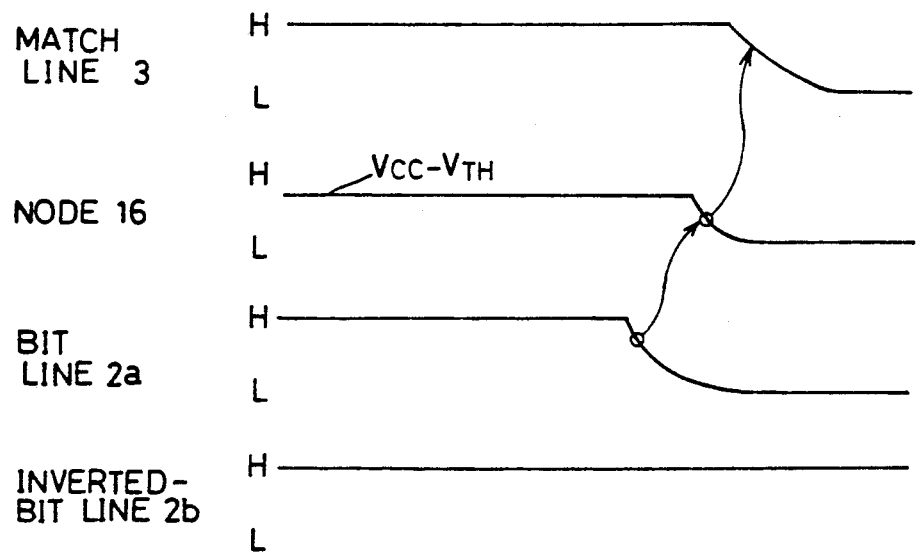
Figure 3B:
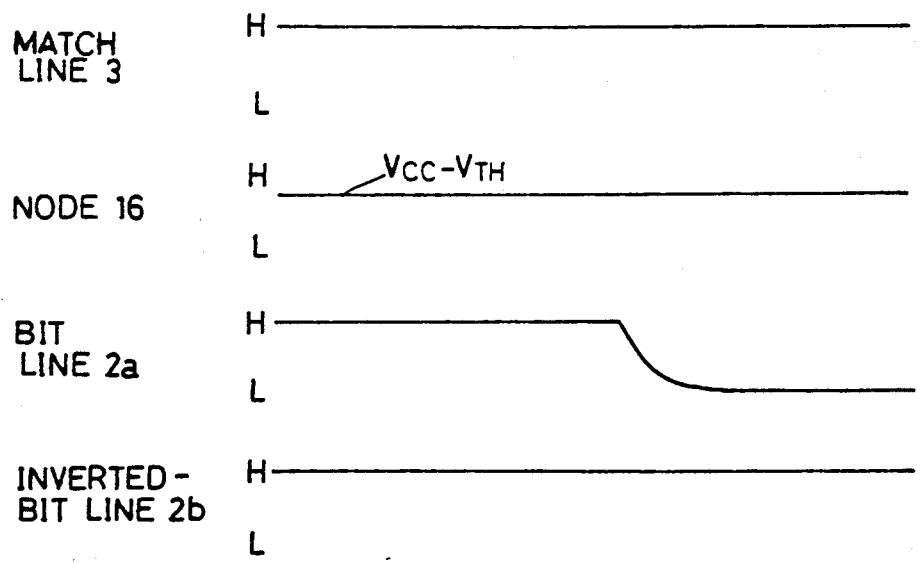
Figure 4:
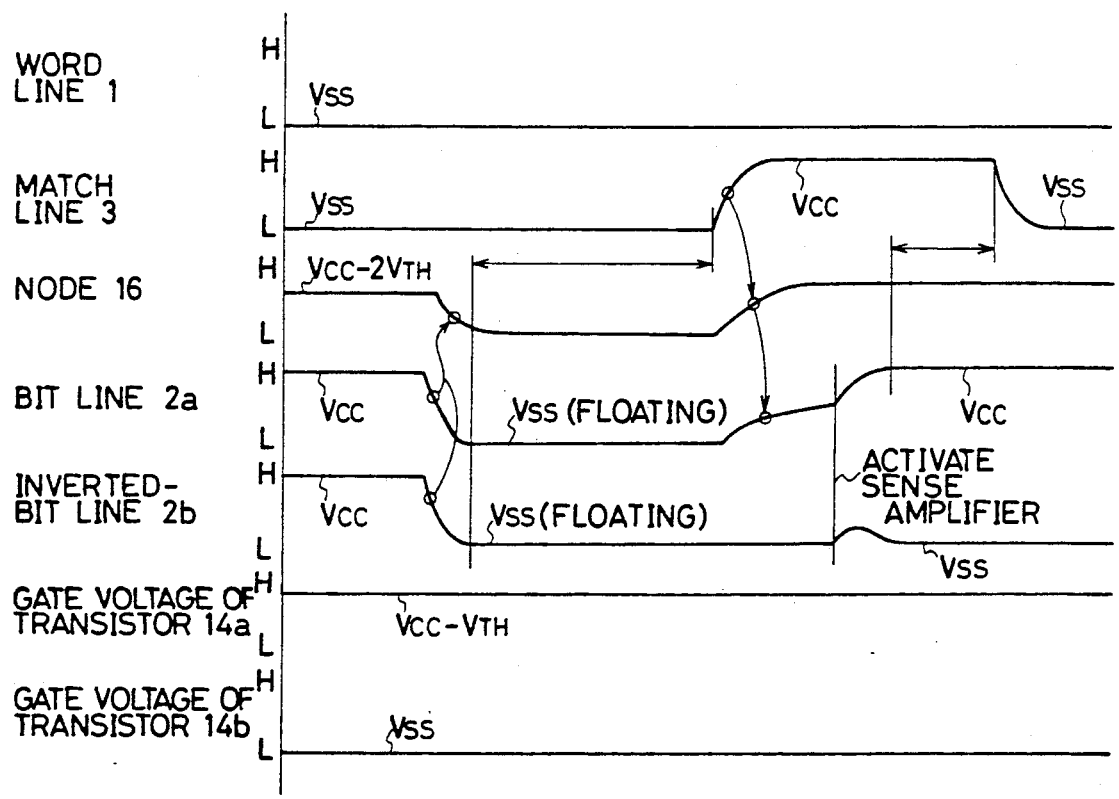
Figure 9:
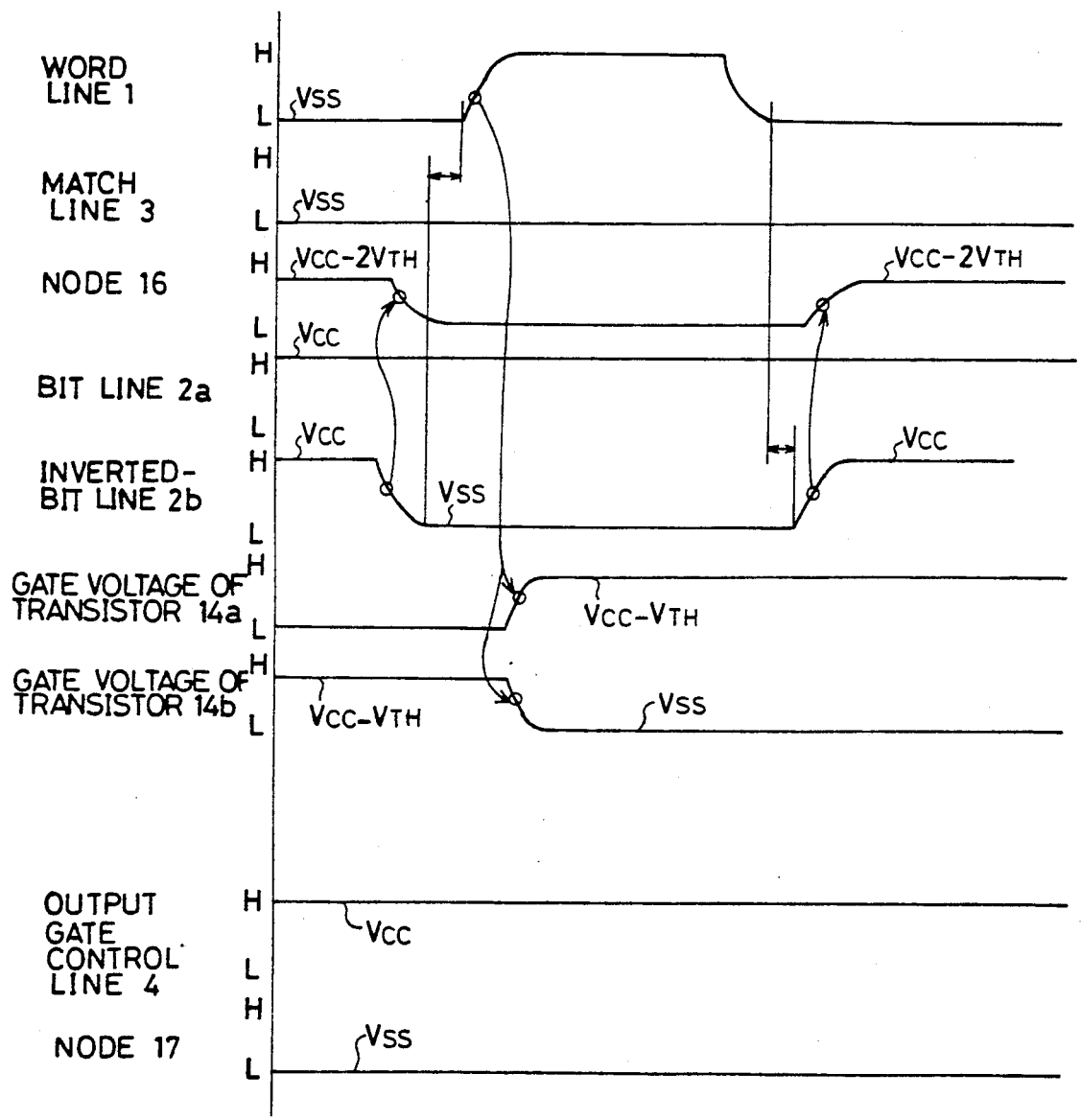
Figure 10:
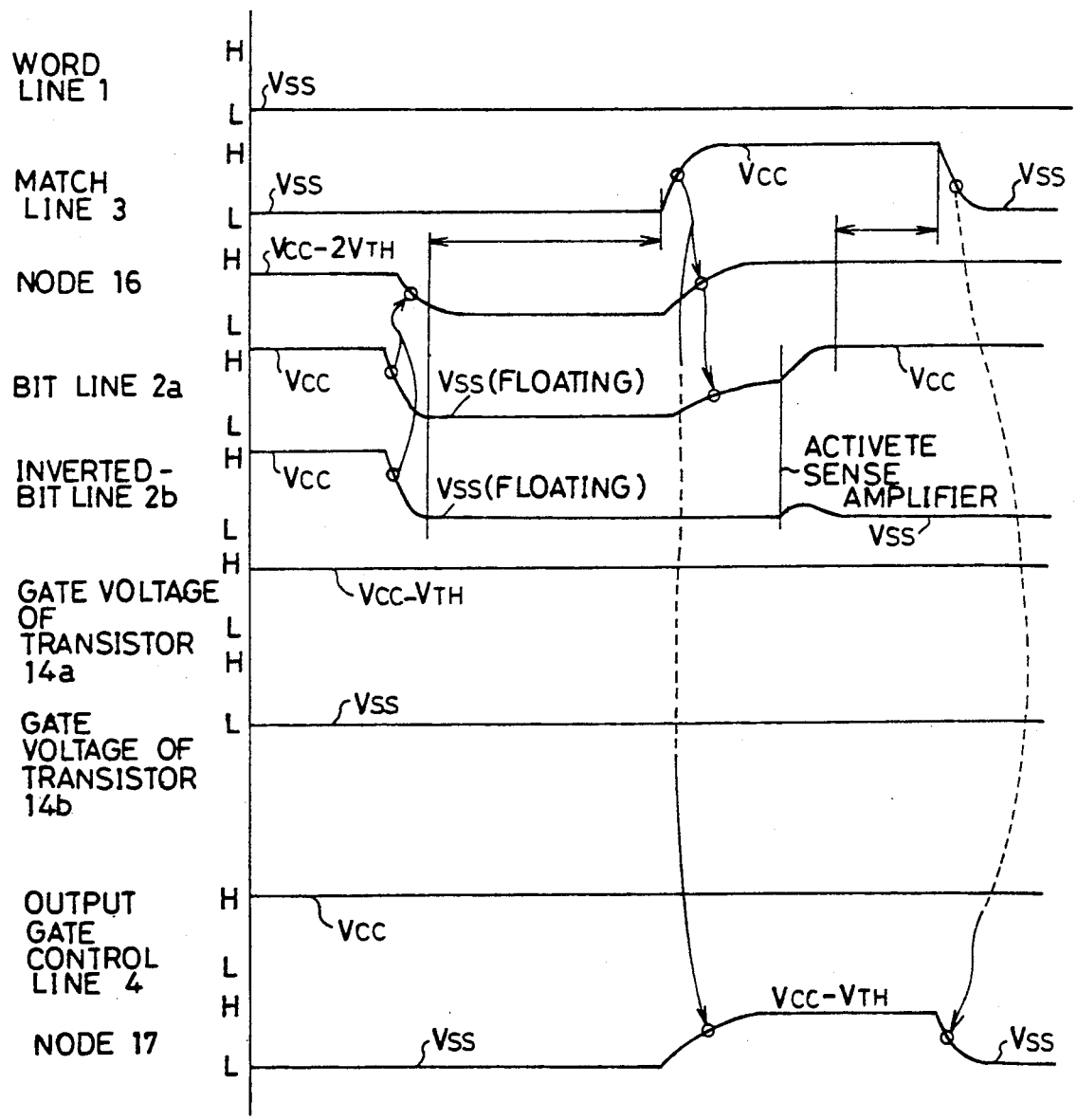

Now, operation of the CAM cell 61 shown in FIG. 8 will be described for its matching operation only. The writing and reading operations are, as shown in FIGS. 9 and 10, respectively, substantially the same as those of the conventional CAM cell 6 shown in FIG. 1. Therefore, in the embodiment of FIG. 8, the reading and writing operations are the same as those in the conventional CAM cell 6 shown in FIG. 1 except that storage data are stored in the storage capacitance elements 18 and 18b.

Matching Operation

In matching operation, all of the bit line 2a, the inverted-bit line 2b, the output gate control line 4 and the match line 3 are first raised to the "H" level (Vcc) thereby to precharge the first and the second control terminals 16 and 17 to the "H" level. Therefore, an "H" level (more precisely Vcc-$V_{TH}$, where $V_{TH}$ represents threshold voltage of the output gate 11) is stored in the capacitance element 9 at this moment. Second, the output gate control line is turned down to the "L" level ($V_{SS}$) to put the output gate 11 in its off-state.

Subsequently, retrieval data is applied to the bit line 2a while its inverted data is applied to the inverted-bit line 2b. If the comparison result between the storage data in the data storage portion 71 and the retrieval data represent match at this moment, the first and second control terminals 16 and 17 are held at the "H" level. On the other hand, the comparison result between the storage data and the retrieval data represents mismatch, the first and second control terminals 16 and 17 falls to the "L" level. Details of the operation at this moment will become more apparent when reference is made to the operation of the conventional CAM cell 6 in FIG. 1.

Furthermore, both of the bit line 2a and the inverted-bit line 2b are raised to the "H" level again thereby to charge the first control terminal 16 to the "H" level. At this moment, the second control terminal 17 holds the comparison result above (this will represent "H" when match exists, or otherwise, "L") under the influence of the diode 15.

Thereafter, the match line 3 is precharged to the "H" level ($V_{CC}$) and an appropriate potential ($V_{CL}$) is applied to the output gate control line 4, supposing that $V_{SS} + V_{TH} < V_{CL} \leq V_{CC}$ (where $V_{TH}$ represents threshold voltage of the n-channel MOS transistor 11 and $V_{SS}$ represents ground potential). If the second control terminal 17 is then at the "H" level (or the comparison result above represents match), the output gate 11 is held in its off-state. If the second control terminal 17 is at the "L" level (or the comparison result above represents mismatch), however, the output gate 11 is turned on, so that the second control terminal 17 is charged from the "L" ($V_{SS}$) level to $V_{CL} - V_{TH}$.

Assuming now that capacitance value of the capacitance element 9 is $C_S$, capacitance value of the parasitic capacitance on the match line 3 is $C_M$ and potential on the match line 3 is $V_M$, and that mismatch is found in n CAM cells 61 out of a plurality of CAM cells 61 connected to a single match line 3, the potential on the match line 3 changes from $$V_M = V_{CC}$$

to $$V_M = V_{CC} - n \times \frac{C_S}{C_M} (V_{CL} - V_{TH} - V_{SS}).$$

Figure 11A:
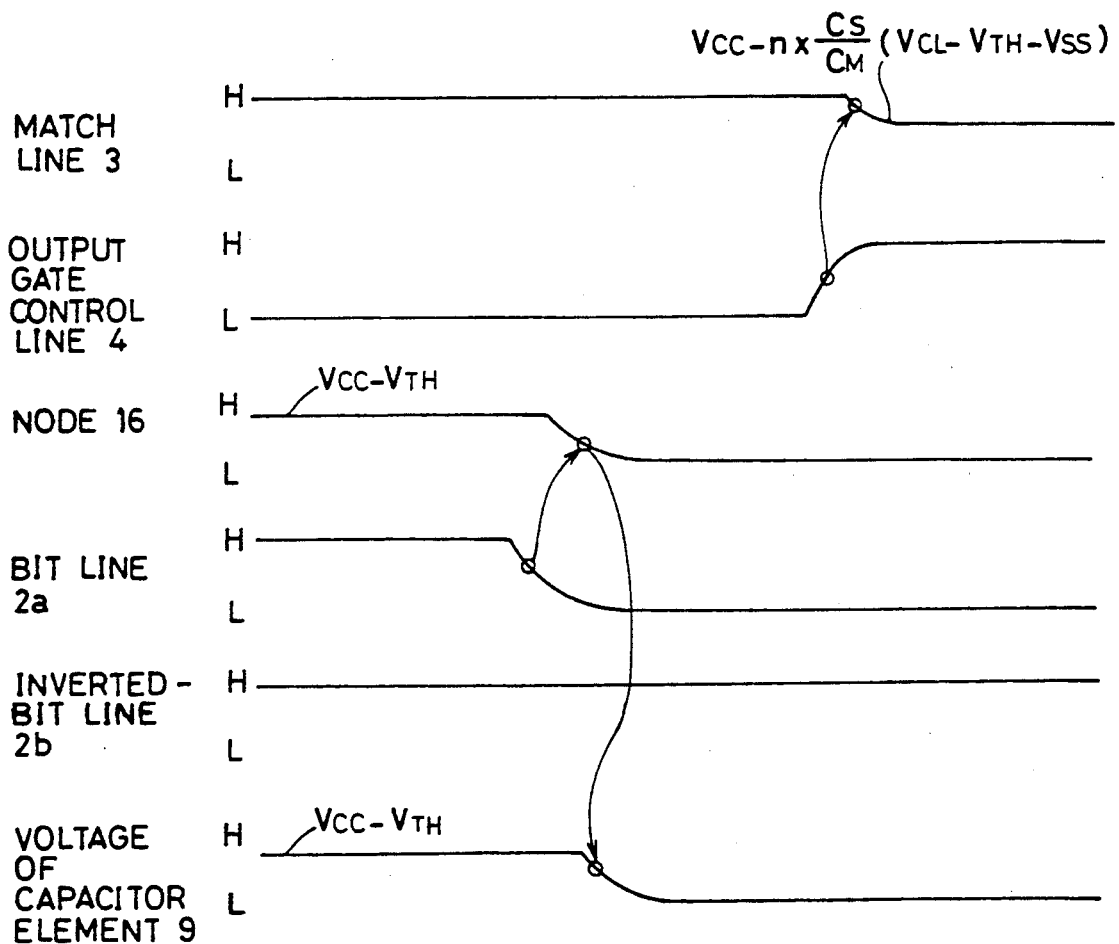

For reference, waveform charts of the respective cases that a mismatch bit does and does not exist in the matching are shown in FIGS. 11A and 11B.

Figure 12:
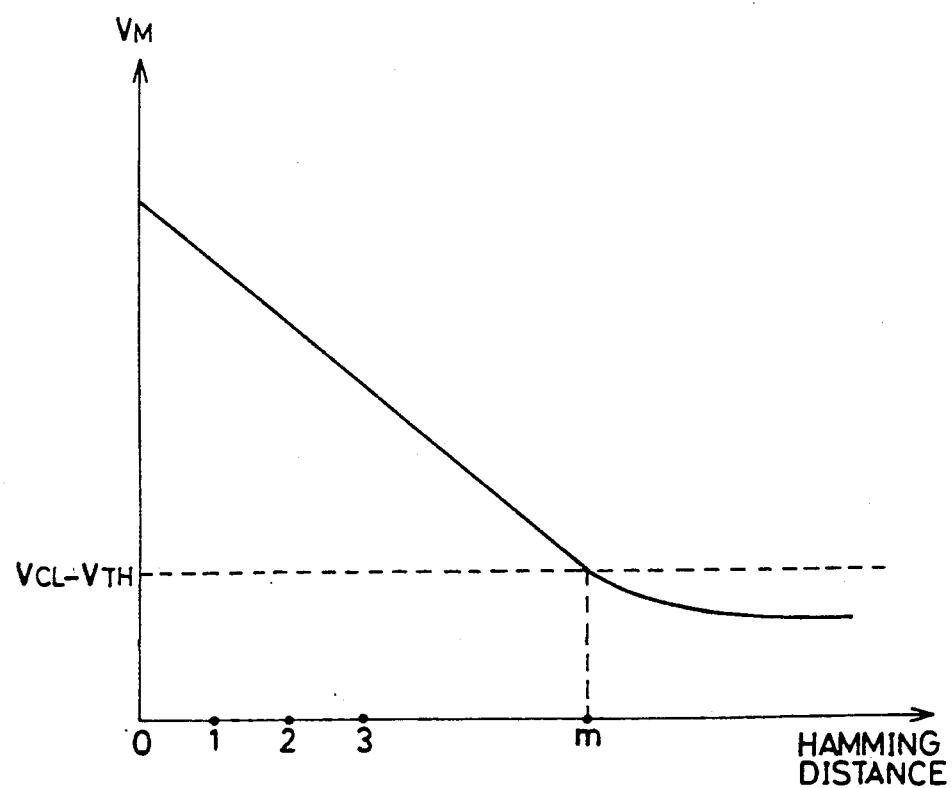
FIG. 12 is a diagram showing relation between Hamming distance and potential on a match line in connection with the embodiment shown in FIG. 8.

As described above, since the potential level on the match line 3 changes depending on the number n of those of the CAM cells 61 in which mismatch has been detected, retrieval of the storage data at a Hamming distance of n from the retrieval data ca be implemented by detecting only a match line 3 that has a potential level of $$V_M = V_{CC} - n \times \frac{C_S}{C_M} (V_{CL} - V_{TH} - V_{SS})$$

with a match detection circuit connected to the match line 3 concerned. The relation between the potential $V_M$ of the match line 3 and Hamming distance is shown in FIG. 12. As shown in FIG. 12, until Hamming distance reaches a certain value m, the potential $V_M$ changes linearly, but once Hamming distance exceeds m, the potential $V_M$ changes non-linearly. The value m can be obtained as one meeting the following equation.

$$m \frac{C_S}{C_M} (V_{CC} - V_{TH} - V_{SS}) = V_{CL} - V_{TH}$$

Figure 13:
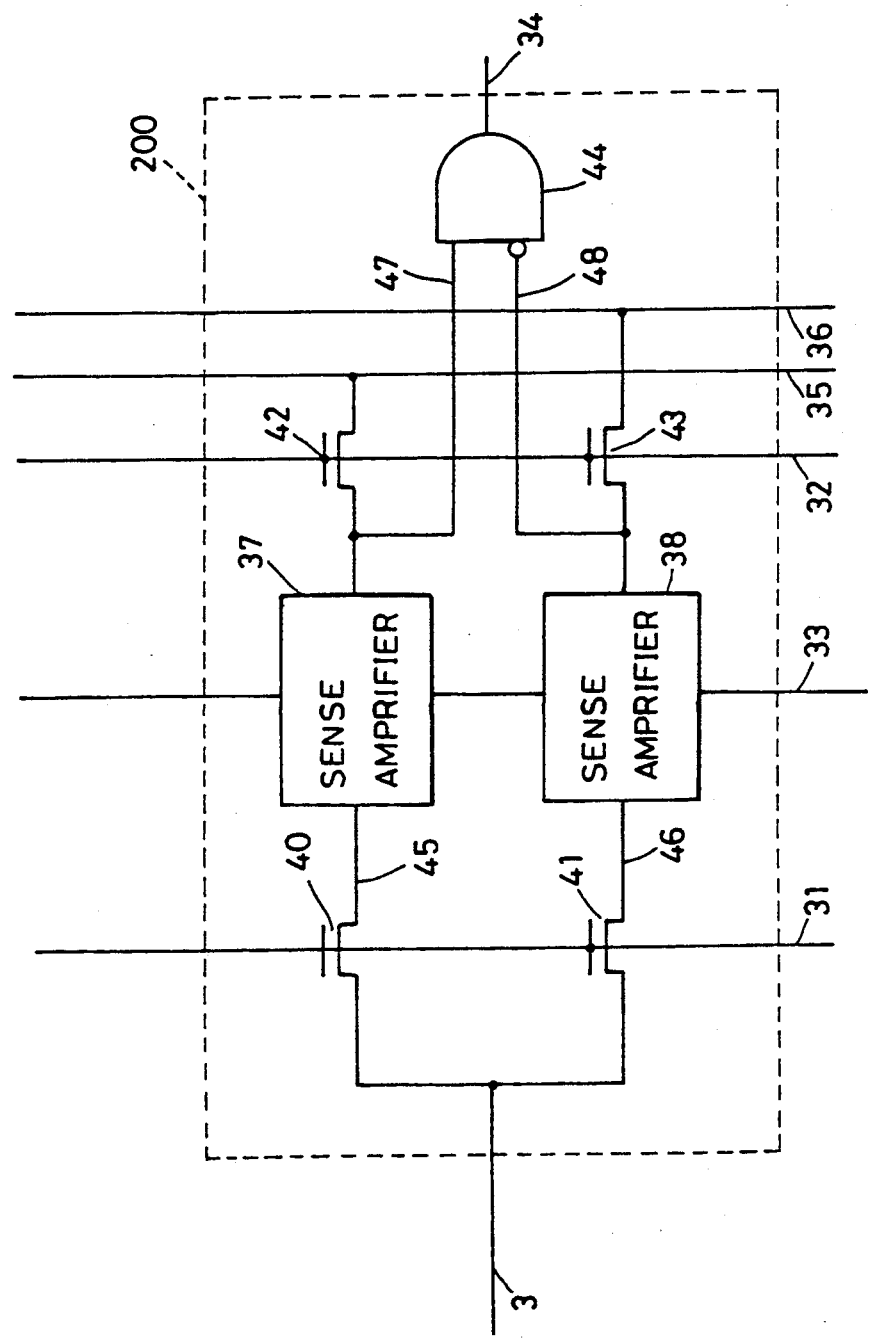
FIG. 13 is a circuit diagram showing a structure of a match detection circuit for detecting potential on the respective match lines of a CAM array comprising the CAM cells according to the present invention.

An example of such a match detection circuit as performing the above described function is shown in FIG. 13. In the diagram, a match detection circuit 200 is connected to a match line 3, control lines 31 and 32, a sense amplifier activating line 33, reference potential supply lines 35 and 36, and an output line 34. The match detection circuit 200 comprises sense amplifiers 37 and 38, n-channel MOS transistors 40 to 43 and a logic gate 44.

Now, operation of the match detection circuit 200 shown in FIG. 13 will be described on a case where storage data at a Hamming distance of n should be retrieved. First, the sense amplifier activating line 33 is rendered inactive (for example to the "L" level) and a voltage of $V_{CC} + V$ is applied to the control lines 31 and 32 (where V is a value greater than the respective threshold voltages of the n-channel MOS transistors 40 to 43). All of the n-channel MOS transistors 40 to 43 are then turned on. Second, $V_R(35)$ and $V_R(36)$ as given by the following expressions are applied to the reference potential supply lines 35 and 36, respectively. At the same time, matching operation is performed in the CAM array, resulting in the potential value of $V_{ML}$ (3) defined by the following expression on the match line 3.

$$V_R(35) = V_{CC} - \left(n - \frac{1}{2}\right) \times \frac{C_S}{C_M} (V_{CL} - V_{TH} - V_{SS})$$

$$V_R(36) = V_{CC} - \left(n + \frac{1}{2}\right) \times \frac{C_S}{C_M} (V_{CL} - V_{TH} - V_{SS})$$

$$V_{ML}(3) = V_{CC} - n \times \frac{C_S}{C_M} (V_{CL} - V_{TH} - V_{SS})$$

Therefore, in the match detection circuit 200, potential on a node 47 becomes $V_R$ (35), potential on a node 48 becomes $V_R$ (36) and potentials on nodes 45 and 46 both become $V_{ML}$ (3) Now, control lines 31 and 32 are both turned down to the "L" level and all of the n-channel MOS transistors 40 to 43 are turned off. Subsequently, the sense amplifier activating line 33 is activated (to the "H" level) to activate the sense amplifiers 37 and 38. Correspondingly, the sense amplifiers 37 and 38 start sensing operation so that the sense amplifier 37 amplifies potential difference between the nodes 45 and 47 while the sense amplifier 38 amplifies potential difference between the nodes 46 and 48. Since the following relationships exist therebetween, i.e.:

$V_{ML}$ (3) [potential on the node 45] < $V_R$ (35) [potential on the node 47]; and $V_{ML}$ (3) [potential on the node 46] > $V_R$ (36) [potential on the node 48], the sense amplifier 37 drives the node 45 to the "L" level and the node 47 to the "H" level, while the sense amplifier 38 drives the node 46 to the "H" level and the node 48 to the "L" level.

However, when Hamming distance l between the retrieval data and the storage data is l < n (n is Hamming distance to be retrieved) on another match line, the sense amplifier 37 drives the node 45 to the "H" level and the node 47 to the "L" level while the sense amplifier 38 drives the node 46 to the "H" level and the node 48 to the "L" level in the present match detection circuit 200. Further, Hamming distance l between the retrieval data and the storage data is m > n on another match line 3, the sense amplifier 37 drives the node 45 to the "L" level and the node 47 to the "H" level while the sense amplifier 38 drives the node 46 to the "L" level and the node 48 to the "H" level in the present match detection circuit 200.

The logic gate 44 outputs the "H" level on the output line 34 only when the node 47 is at the "H" level and the node 48 at the "L" level. Therefore, it should be understood that only the logic gate 44 in a match detection circuit 200 connected to a match line 3 having a Hamming distance of n outputs the "H" level on its output line 34.

Figure 14A:
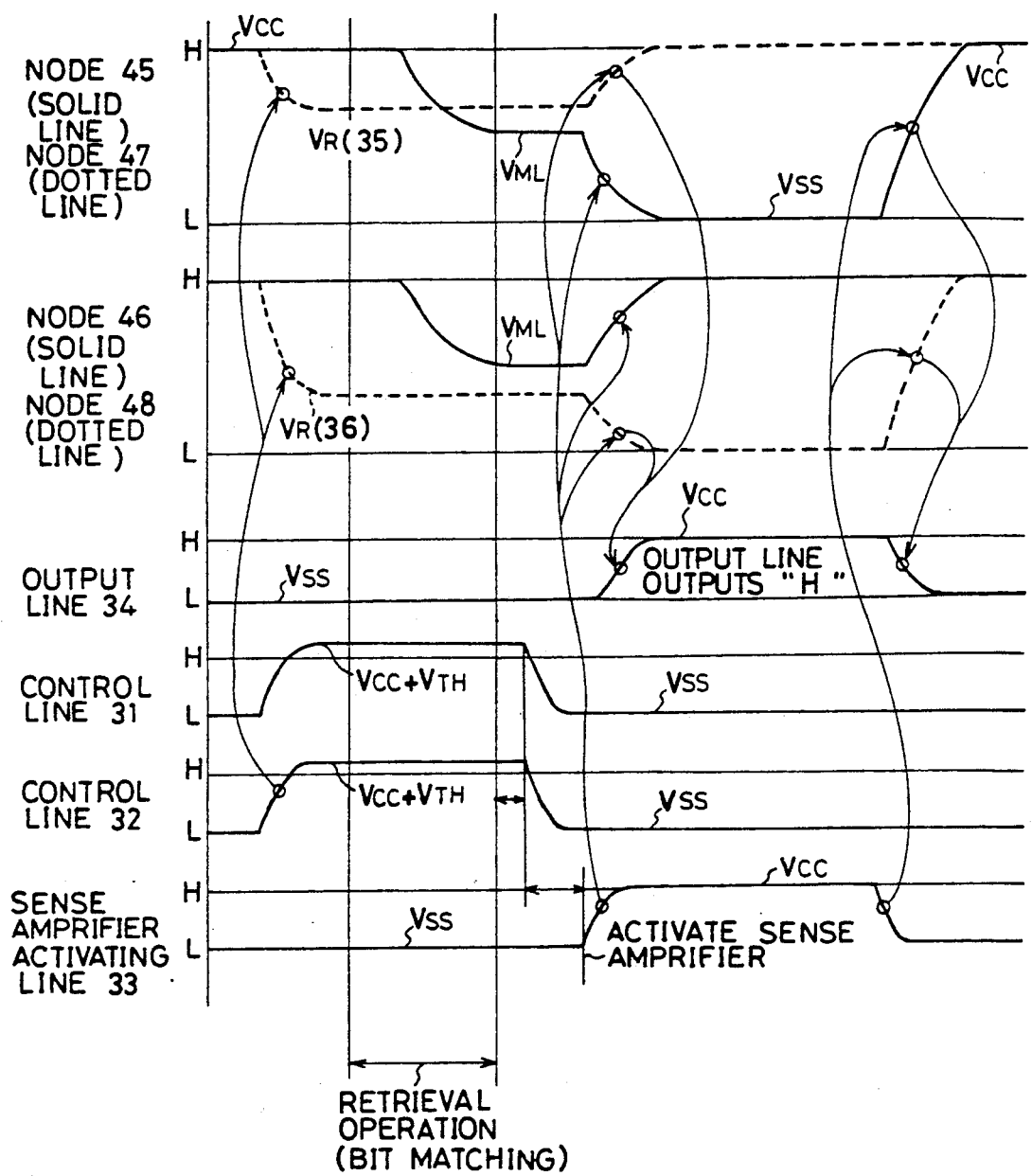
Figure 14C:
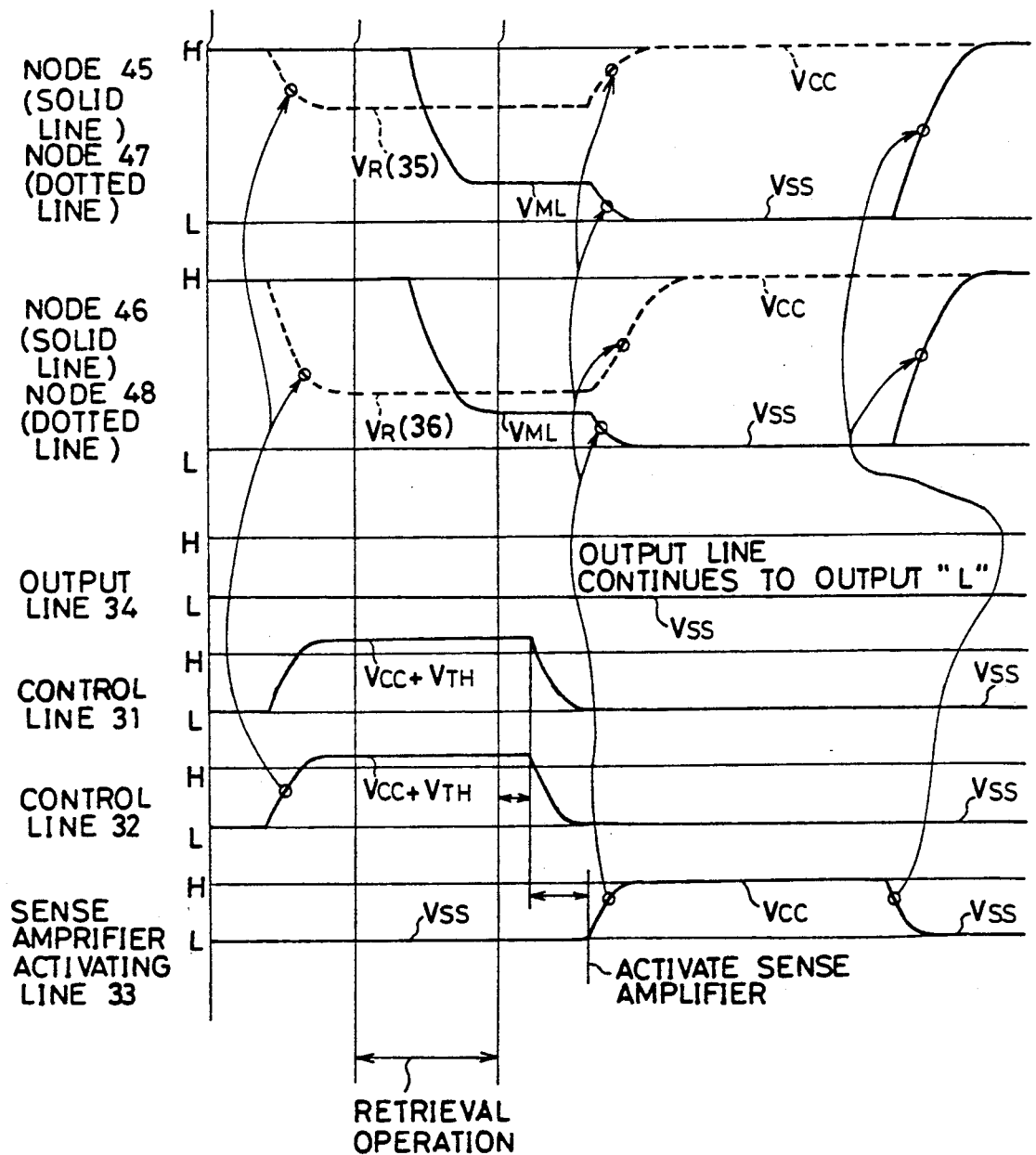

For reference, an operational waveform chart in the case of l=n is shown in FIG. 14A, that in the case of l<n in FIG. 14B, and that in the case of l>n in FIG. 14C, where l represents Hamming distance between retrieval data and storage data and n represents Hamming distance to be retrieved.

Meanwhile, with the use of the match detection circuit 200 mentioned above, retrieval of the storage data at any Hamming distance from the retrieval data (for example, retrieval of the storage data at a Hamming distance of 2 to 5 from the retrieval data) is also possible.

Figure 5:
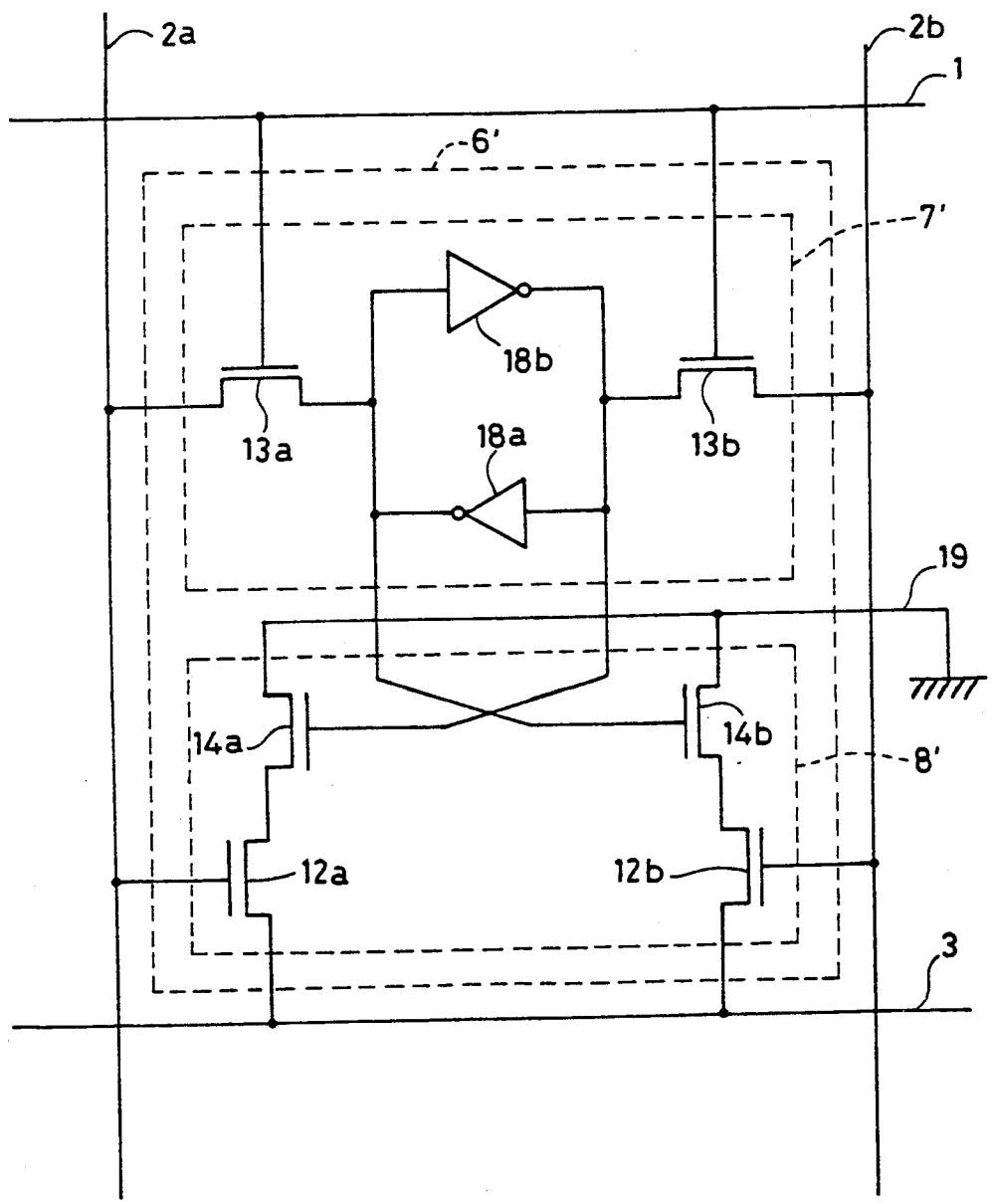
FIG. 5 is a circuit diagram showing another example of a conventional CAM cell.
Figure 6:
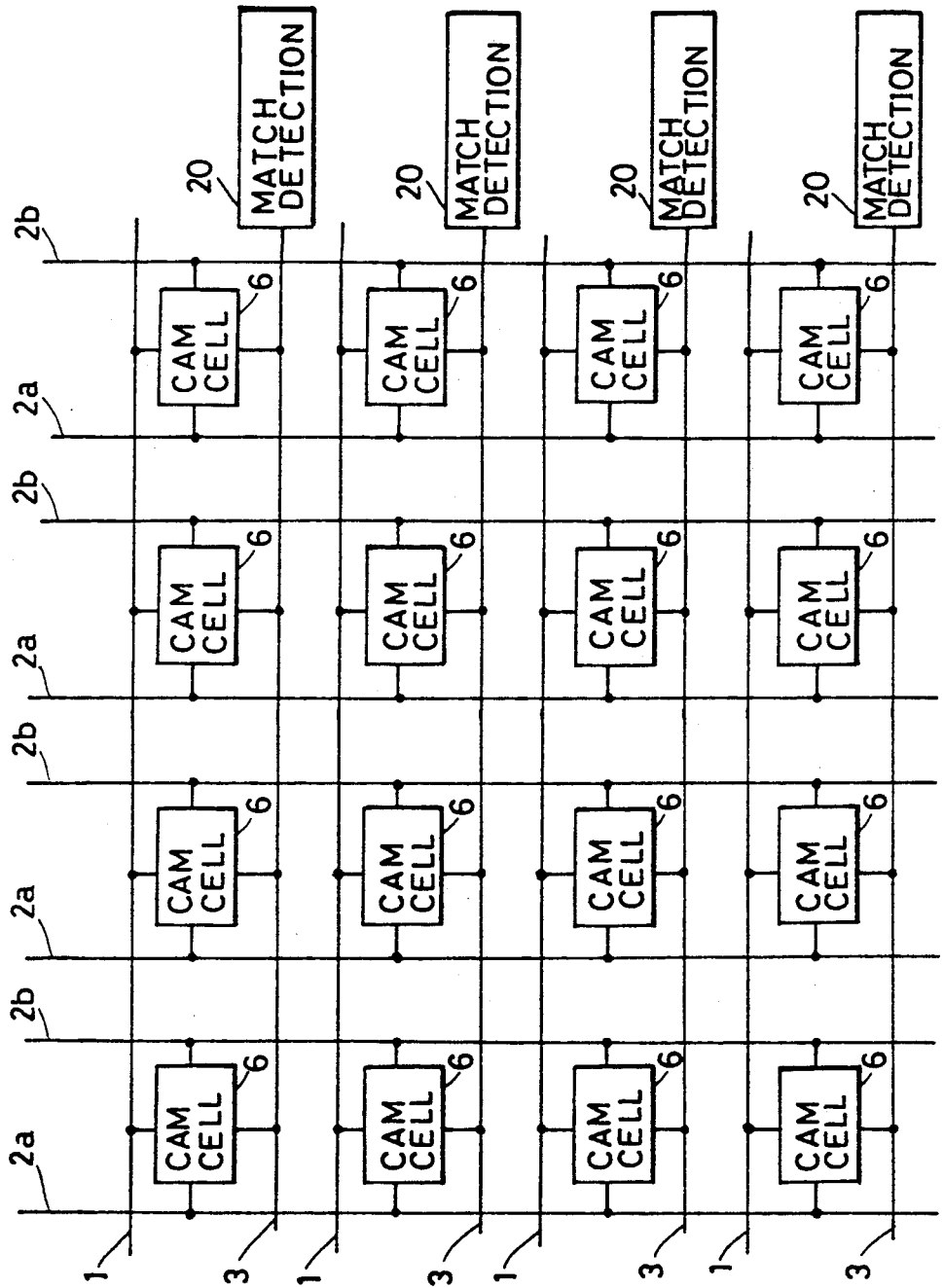
FIG. 6 is a block diagram showing structure of a CAM array constituted of a plurality of CAM cells.

Generally, many of the match lines 3 in a CAM array are found mismatched as the result of the matching operation. In the conventional CAM cell shown in FIG. 1 or FIG. 5, when mismatch is found on the match line 3, charge of the capacitance $C_M$ on the match line 3 is discharged by the bit line 2a or the inverted-bit line 2b so that the total consumption power for the matching operation including precharge of the match line 3 increases considerably. On the other hand, in the CAM cell 61 according to the embodiment shown in FIG. 8, charge of the capacitance $C_M$ on the match line 3 is discharged by the capacitance element 9 of the CAM cell 61 indicating mismatch, so that generally the match line 3 is not discharged completely to the "L" level. Accordingly, the total consumption power for the matching operation including precharge of the match line 3 is less than the conventional case.

As has been described above, in a CAM array constituted of the CAM cells 61 according to the embodiment shown in FIG. 8, retrieval of storage data at any Hamming distance from retrieval data is possible and consumption power in matching operation can be reduced as well.

Figure 15:
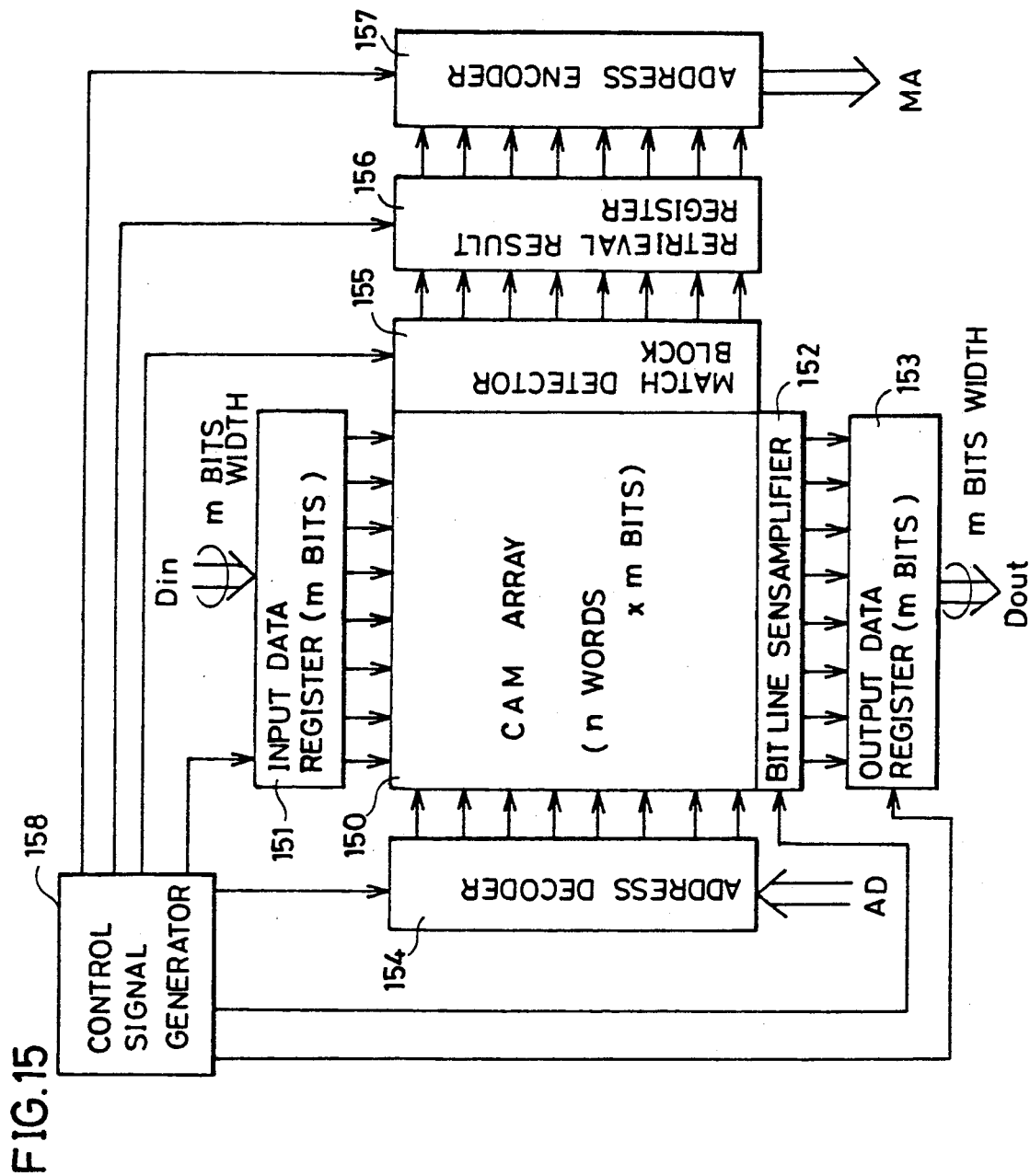
FIG. 15 is a block diagram showing the entire structure of a CAM using the CAM cells shown in FIG. 8.

FIG. 15 is a block diagram showing the entire structure of a CAM using the CAM cells according to the embodiment above. The CAM in FIG. 15 comprises a CAM array 150, an input data register 151, a bit line sense amplifier 152, an output data register 153, an address decoder 154, a match detector block 155, a retrieval result register 156, an address encoder 157 and a control signal generator 158. The CAM array 150 has a plurality of CAM cells arranged in a matrix of n words x m bits. The match detector block 155 includes the match detection circuit 200 shown in FIG. 13 for every word line.

In the following, operation of this CAM will be described.

Data writing operation to the CAM array

First, m-bit write data Din is entered in the input data register 151. The write data entered in the input data register 151 is applied to all the bit line pairs of the CAM array 150. Then, an address signal AD ($\log_2 n$ bits width) is entered in the address decoder 154. The address decoder 154 decodes the address signal AD to select a word. The word line correspond to the selected word is raised to the "H" level so that the write data on the respective bit line pairs are written in the corresponding CAM cells. Finally, the word line is driven to the "L" level again.

Data reading operation from the CAM array

An address signal AD is entered in the address decoder 154. The address decoder 154 decodes the address signal AD to select a word. A match line corresponding to the word is driven to the "H" level so that the data in the respective CAM cells contained in the selected word are read out on the corresponding bit line pairs. The data read out on the bit line pairs are amplified by the bit line sense amplifier 152 to be written in the output data register 153. The data written in the output data register 153 is outputted as output data Dout.

(Match retrieval operation for the CAM array

First, m-bit retrieval data is entered in the input data register 151. The data entered in the input data register 151 is applied to all the bit line pairs in the CAM array 150. For all the n words in the CAM array 150, comparison is made between the respective storage data of the words and the retrieval data applied to the respective bit line pairs to output the comparison results on the match lines. The comparison results outputted on the match lines of the respective words are applied to the detector block 155 where data having a predetermined Hamming distance is retrieved. The retrieval result of the match detector block 155 is written in the corresponding word in the retrieval result register 156. Thus, a register corresponding to the word having the predetermined Hamming distance between the storage data and the retrieval data is set. In response to the result from the retrieval result register 156, the address encoder 157 outputs an address corresponding to the word having the predetermined Hamming distance between the storage data and the retrieval data as a retrieval result address MA.

(2) Second embodiment

Figure 16:
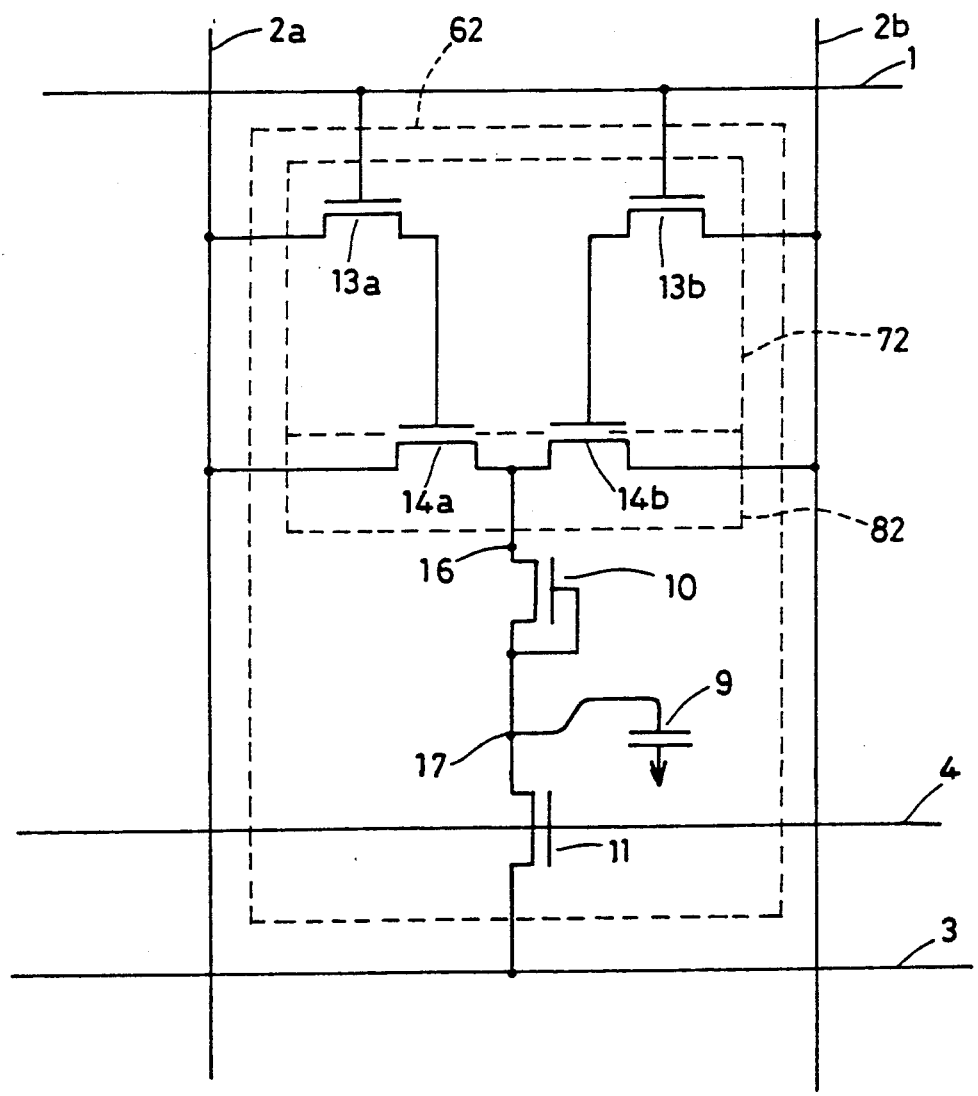
FIG. 16 is a circuit diagram showing structure of a second embodiment according to the present invention.

FIG. 16 is a circuit diagram showing a structure of a second embodiment according to the present invention. In the diagram, a CAM cell 62 of the second embodiment comprises a data storage portion 72 and a data comparison portion 82 which are constituted in the same manner as the data storage portion 7 and the data comparison portion 8 comprised in the conventional CAM cell 6 shown in FIG. 1. The other structure is the same as that of the first embodiment shown in FIG. 8 except that the diode 15 in the embodiment of FIG. 8 is replaced by an n-channel MOS transistor 10. This n-channel MOS transistor 10 has the drain connected to a first control terminal 16 and the source and the gate both connected to a second control terminal 17. This means that the n-channel MOS transistor 10 functions as a diode. Operation of the CAM cell 62 in the second embodiment is the same as that of the CAM cell 61 in the first embodiment shown in FIG. 8 except that storage data is stored in gate capacitance of the transistors 14a and 14b.

(3) Third embodiment

Figure 17:
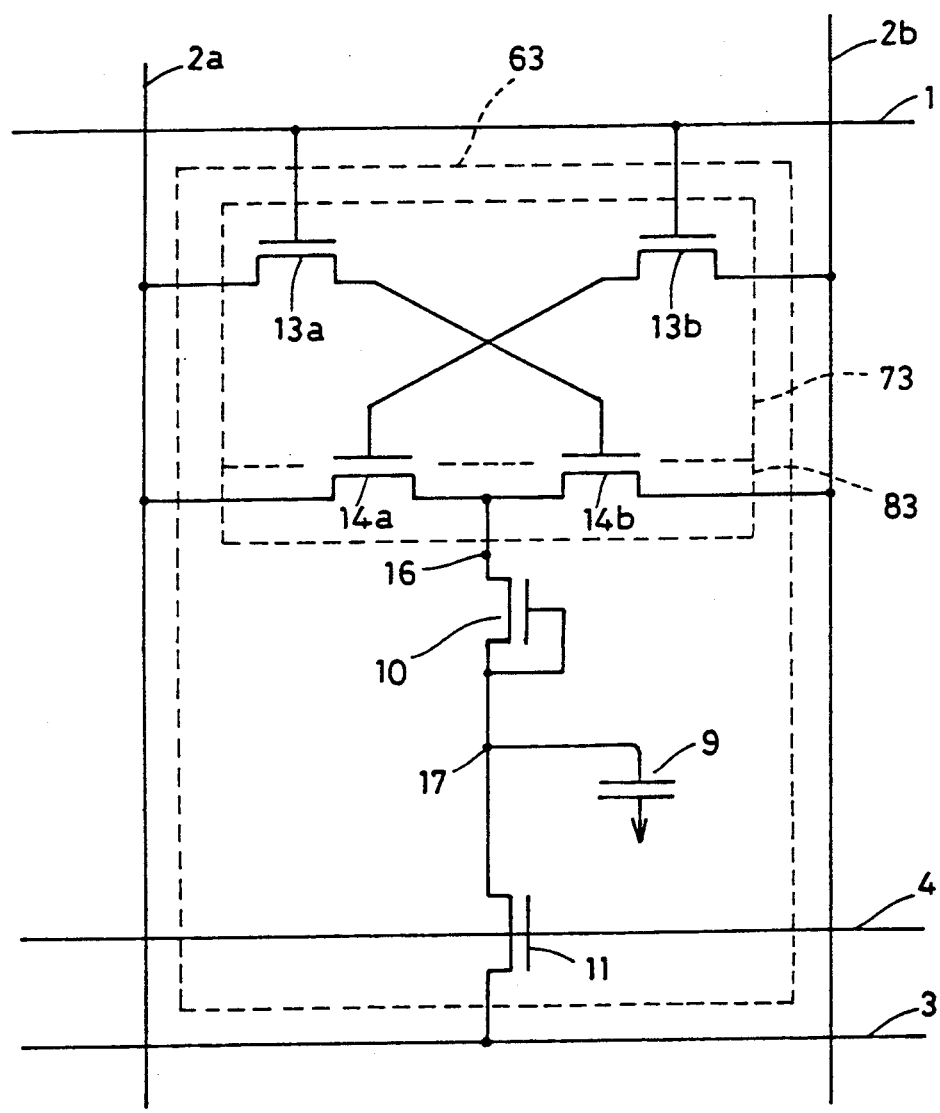
FIG. 17 circuit diagram showing structure of a third embodiment according to the present invention.

FIG. 17 is circuit diagram showing a structure of a third embodiment according to the present invention. A CAM cell 63 in the third embodiment is constituted substantially in the same manner as the CAM cell 62 of the second embodiment shown in FIG. 16. It is to be noted here, however, that the n-channel MOS transistor 13a is connected between the bit line 2a and the gate of the n-channel MOS transistor 14b and the n-channel MOS transistor 13b is connected between the inverted-bit line 2b and the gate of the n-channel MOS transistor 14a in a data storage portion 73.

Operation of the CAM cell 63 in the third embodiment above is substantially identical with that of the second embodiment shown in FIG. 16, but different in that logic of data to be applied to a pair of the bit line 2a and the inverted-bit line 2b is inverted differently between writing, reading and matching operations. More specifically, assuming that logic of the storage data is "1" in a case where an "H" level is applied to the bit line 2a and an "L" level is applied to the inverted-bit line 2b, and the word line 1 is raised to the "H" level to store data in the data storage portion 73 in the CAM cell 63, then gate capacitance of the n-channel MOS transistor 14a is charged with the "L" level while gate capacitance of the n-channel MOS transistors 14b is charged with the "H" level. In matching operation for this CAM cell 63, match is found in the CAM cell 63 when an "L" level is applied to the bit line 2a and an "H" level is applied to the inverted bit-line 2b as retrieval data. Therefore, as opposed to the fact that in writing operation, logic of the written data is "1" when the bit line 2a is at the "H" level and the inverted-bit line 2b is at the "L" level, in matching operation logic of the retrieval data is "1" when the bit line 2a is at the "L" level and the inverted-bit line 2b is at the "H" level. This means that logic of the data to be applied to a bit line has been inverted. Meanwhile, the effects of the present third embodiment are equivalent to those seen in the CAM cell of the embodiment shown in FIG. 8 or FIG. 16.

(4) Fourth embodiment

Figure 18:
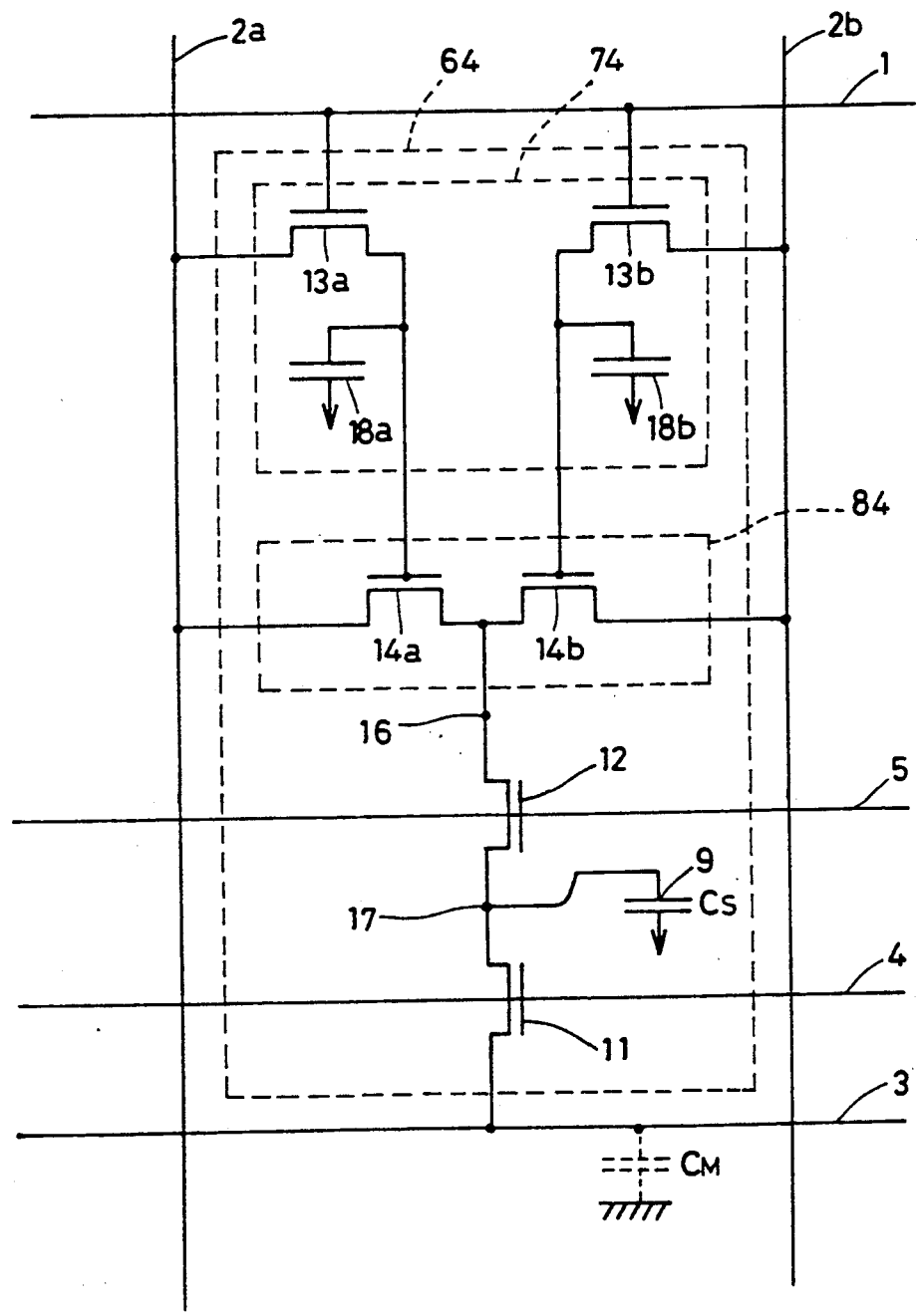
FIG. 18 is a circuit diagram showing structure of a fourth embodiment according to the present invention.

FIG. 18 is a circuit diagram showing a structure of a fourth embodiment according to the present invention. In the diagram, a CAM cell 64 according to the fourth embodiment is constituted substantially in the same manner as the CAM cell 61 of the first embodiment shown in FIG. 8 except that the diode employed in the embodiment of FIG. 8 is replaced by a switch element 12. This switch element 12 is constituted of an n-channel MOS transistor which has the drain connected to the first control terminal 16 and the source connected to the second control terminal 17. Furthermore, the gate of the switch element 12 is connected to a switch element control line 5.

In the following, operation of the CAM cell 64 in the fourth embodiment above will be described for its matching operation only. The writing and reading operations are performed in the same manner as those of the CAM cell 61 of the first embodiment shown in FIG. 8.

Bit Matching Operation

In matching operation, first, the output gate control line 4 is turned down to the "L" level and the switch element control line 5 is raised to the "H" level thereby to turn the output gate 11 off and the switch element 12 on. Second, retrieval data are inputted to the bit line 2a and the inverted-bit line 2b. If any match is found between the storage data and the retrieval data at this moment, the first and second control terminals 16 and 17 are charged to the "H, level, while if any mismatch is found therebetween, the first and second control terminals 16 and 17 are discharged to the "L" level. Assuming for example that an "H" level is stored in the storage capacitance element 18a and an "L" level is stored in the storage capacitance element 18b, the n-channel MOS transistor 14a is in its on-state and the n-channel MOS transistor 14b is in its off-state. When an "H" level is applied to the bit line 2a and an "L" level is applied to the inverted-bit line 2b in this state, the first and second control terminals 16 and 17 are charged by the bit line 2a to the "H" level by way of the n-channel MOS transistors 12 and 14a (match). Conversely, when an "L" level is applied to the bit line 2a and an "H" level is applied to the inverted-bit line 12b, the first and second control terminals 16 and 17 are discharged by the bit line 2a to the "L" level by way of the n-channel MOS transistors 12 and 14a (mismatch). Furthermore, an "H" level is applied to both of the bit line 2a and the inverted-bit line 2b, the first and second control terminals 16 and 17 are precharged by the bit line 2a to the "H" level by way of the n-channel MOS transistors 12 and 14a (mask).

Next, the switch element control line 5 is turned down to the "L" level thereby to render the switch element 12 off. Since the first and second control terminals 16 and 17 are electrically disconnected from each other at this moment, it is no longer necessary for the first control terminal 16 to be charged to the "H" level by charging the bit line 2a and the inverted-bit line 2b both to the "H" level as in the first embodiment shown in FIG. 8.

Subsequently, the match line 3 is precharged to the "H" level ($V_{CC}$) and an appropriate potential $V_{CL}$ is applied to the output gate control line 4 on condition that $V_{SS} + V_{TH} < V_{CL} \leq V_{CC}$ (where $V_{TH}$ represents threshold voltage of the n-channel MOS transistor 11 and $V_{SS}$ represents ground potential). If the second control terminal 17 is at the "H" level (or if the comparison result above represents match) at this moment, the output gate 11 is held in its off-state. On the contrary, if the second control terminal 17 is at the "L" level (or if the comparison result above represents mismatch), the output gate 11 is turned on so that the second control terminal 17 is charged from the "L" level ($V_{SS}$) to $V_{CL} - V_{TH}$.

Assuming here that capacitance value of the capacitance element 9 is $C_S$, capacitance value of the parasitic capacitance on the match line 3 is $C_M$ and potential on the match line 3 is $V_M$, and that mismatch is found in n CAM cells 64 out of a plurality of CAM cells 64 connected to a single match line 3, the potential on the match line 3 changes from $$V_M = V_{CC}$$

to $$V_M = V_{CC} - n \times \frac{C_S}{C_M} (V_{CL} - V_{TH} - V_{SS})$$

Therefore, since the potential level of the match line changes according to the number n of those CAM cells 64 showing mismatch, retrieval of the storage data at a Hamming distance of n from the retrieval data can be implemented by detecting only a match line 3 that has a potential level of $$V_M = V_{CC} - n \times \frac{C_S}{C_M} (V_{CL} - V_{TH} - V_{SS})$$

with a match detection circuit connected to the match line 3 concerned. As a match detection circuit performing such a function, for example, the match detection circuit 200 shown in FIG. 13 can be employed.

As described above, a CAM array constituted of the CAM cells 64 shown in FIG. 18 enables retrieval of storage data at any Hamming distance from retrieval data and reduction of consumption power in matching operation as well.

Furthermore, in the CAM cell 64 shown in FIG. 8, a pair of the bit line 2a and the inverted-bit line 2b and the second control terminal 17 can be completely disconnected by the switch element 12, so that it is no longer required for the bit line 2a and the inverted-bit line 2b to be precharged both to the "H" level between first and second matching operations. Accordingly, consumption power can be reduced much more than in the embodiments shown in FIGS. 8 and 16 to 17.

(5) Fifth embodiment

Figure 19:
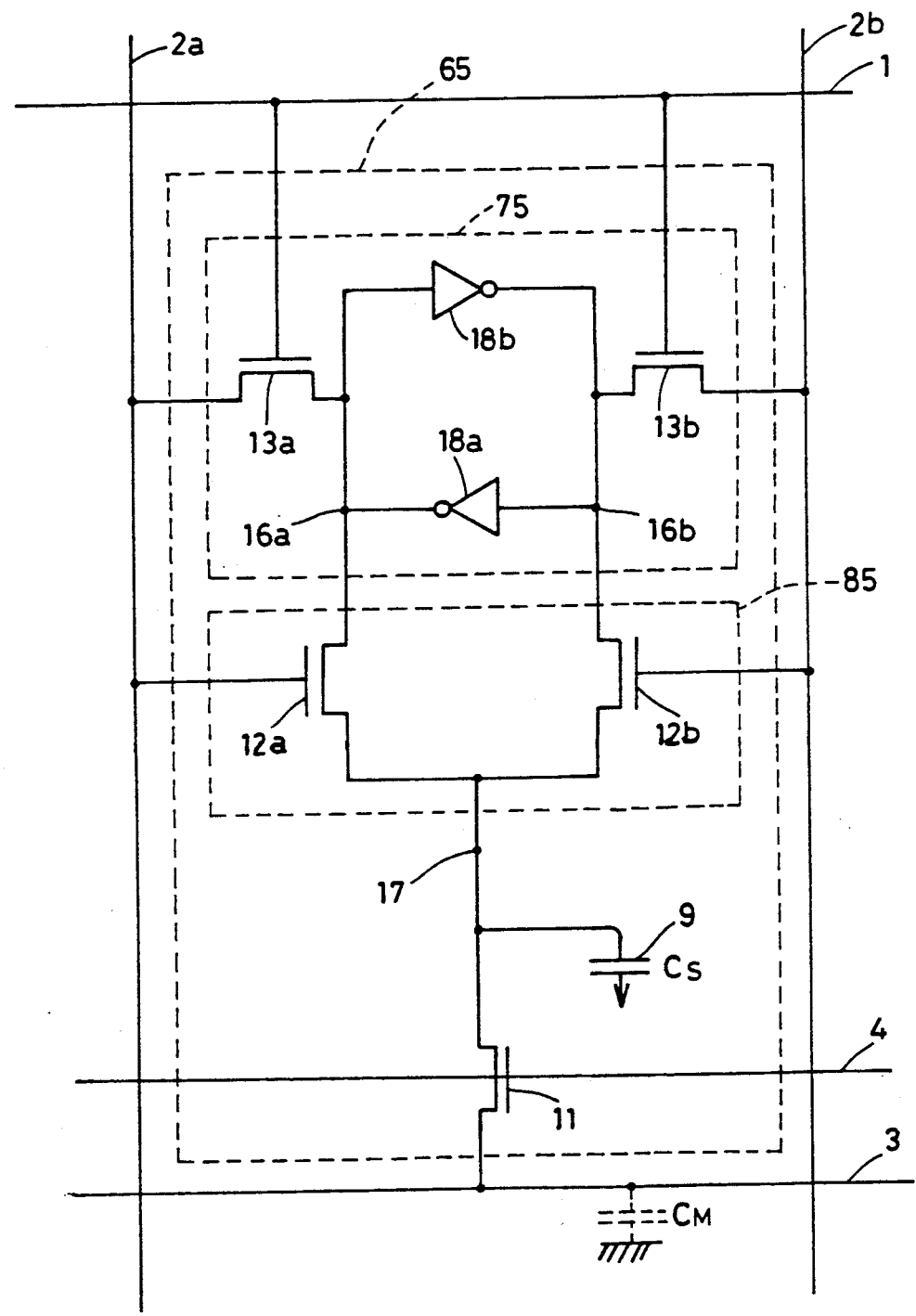
FIG. 19 is a circuit diagram showing structure of a fifth embodiment according to the present invention.

FIG. 19 is a circuit diagram showing a structure of a fifth embodiment according to the present invention. In the diagram, a CAM cell 65 is connected to a word line 1, a bit line 2a, an inverted-bit line 2b, a match line 3 and an output gate control line 4. The CAM cell 65 comprises a data storage portion 75, a data comparison portion 85, a capacitance element 9 and an output gate 11.

The data storage portion 75 comprises two inverters 18a and 18b cross-coupled to each other and two n-channel MOS transistors 13a and 13b. The data comparison portion 85 comprises two n-channel MOS transistors 12a and 12b. The n-channel MOS transistor 13a has the gate connected to the word line 1, the source connected to the bit line 2a and the drain connected to a storage node 16a. The n-channel MOS transistor 13b has the gate connected to the word line 1, the source connected to the inverted-bit line 2b and the drain connected to another storage node 16b. Furthermore, output of the inverter 18a and input of the inverter 18b are connected to the storage node 16a while input of the inverter 18a and output of the inverter 18b are connected to the storage node 16b. Meanwhile, the n-channel MOS transistor 12a is connected between the storage node 16a and the control terminal 17, the gate of which is connected to the bit line 2a. The n-channel MOS transistor 12b is connected between the storage node 16b and the control terminal 17, the gate of which is connected to the inverted-bit line 2b. Furthermore, the output gate 11 is constituted of an n-channel MOS transistor which is connected between the match line 3 and the control terminal 17 and has the gate connected to the output gate control line 4. Further, the capacitance element 9 (capacitance value $C_S$) is connected to the control terminal 17. Meanwhile, the match line 3 has parasitic capacitance (capacitance value $C_M$).

In the following, operation of the CAM cell 65 shown in FIG. 19 will be described for its matching operation only. The writing and reading operations are performed substantially in the same manner as those of the conventional CAM cell 6' shown in FIG. 5.

Matching Operation

In matching operation, first, the output gate control line 4 is turned down to the "L" level to turn the output gate 11 off, and retrieval data is inputted to the bit line 2a and the inverted-bit line 2b. At this moment, if match is found between the storage data and the retrieval data, the control terminal 17 is charged to the "H" level, or if any mismatch is found therebetween, the control terminal 17 is discharged to the "L" level. For example, assuming that the storage node 16a is at the "H" level and the storage node 16b is at the "L" level, entry of retrieval data "H" to the bit line 2a and "L" to the bit line 2b turns the n-channel MOS transistor 12a on and the n-channel MOS transistor 12b off. As a result, the control terminal 17 is charged to the "H" level by the storage node 16a (match). On the other hand, entry of retrieval data "L" to the bit line 2a and "H" to the inverted-bit line 2b turns the n-channel MOS transistor 12a off and the n-channel MOS transistor 12b on so that the control terminal 17 is discharged to the "L" level by the storage node 16b (mismatch).

Second, the bit line 2a and the inverted-bit line 2b are both turned down to the "L" level to turn the n-channel MOS transistors 12a and 12b off.

Subsequently, the match line 3 is precharged to the "H" level (VCC) and an appropriate potential $V_{CL}$ is applied to the output gate control line 4, supposing that $V_{SS} + V_{TH} < V_{CL} \leq V_{CC}$ (where $V_{TH}$ represents threshold voltage of the n-channel MOS transistor 11 and $V_{SS}$ represents ground potential). At this moment, if the control terminal 17 is at the "H" level (or the comparison result above represents match), the output gate 11 is held in its off-state. If the control terminal 17 is at the "L" level (or the comparison result above represents mismatch), however, the output gate 11 is turned on so that the control terminal 17 is charged from the "L" level (potential $V_{SS}$) to $V_{CL} - V_{TH}$.

Now, assuming that capacitance value of the capacitance element is $C_S$, capacitance value of the parasitic capacitance on the match line 3 is $C_M$ and potential on the match line 3 is $V_M$, and that mismatch is found in n CAM cells 65 out of a plurality of CAM cells 65 connected to a single match line 3, the potential on the match line 3 changes from $$V_M = V_{CC}$$

to $$V_M = V_{CC} - n \times \frac{C_S}{C_M}(V_{CL} - V_{TH} - V_{SS})$$

Therefore, since the potential level on the match line 3 changes according to the number n of those CAM cells 65 showing mismatch, retrieval of storage data at a Hamming distance of n from retrieval data can be implemented by detecting only a match line 3 having a potential level of $$V_M = V_{CC} - n \times \frac{C_S}{C_M}(V_{CL} - V_{TH} - V_{SS})$$

with a match detection circuit connected to the match line 3 concerned. As a match detection circuit performing such a function, for example, the match detection circuit 200 as shown in FIG. 13 can be employed.

A CAM array constituted of the CAM cells 65 a shown in FIG. 19 enables retrieval of storage data at any Hamming distance from retrieval data and reduction of consumption power in matching operation as well.

(6) Sixth embodiment

Figure 20:
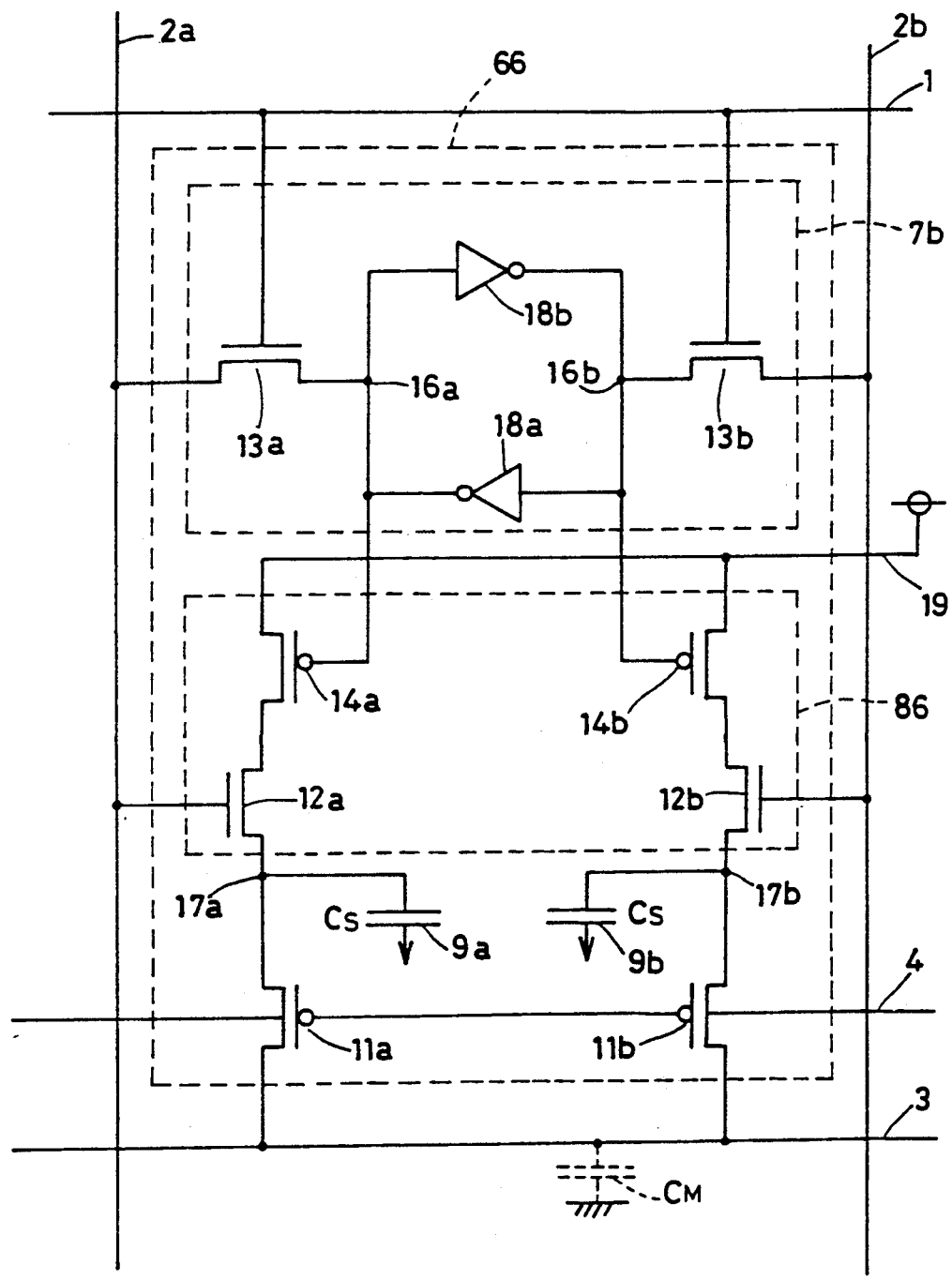
FIG. 20 is a circuit diagram showing structure of a sixth embodiment according to the present invention.

FIG. 20 is a circuit diagram showing a structure of a sixth embodiment according to the present invention. In the diagram, a data storage portion 76 comprised in a CAM cell 66 according to the present sixth embodiment is constituted in the same manner as the data storage portion 75 in the CAM cell 65 according to the fifth embodiment shown in FIG. 19. The data comparison portion 86 comprises two n channel MOS transistors 12a and 12b and two p-channel MOS transistors 14a and 14b. The n-channel MOS transistors 12a and the p-channel MOS transistor 14a are connected in series between a power supply line 19 and a control terminal 17a. The gate of the n-channel MOS transistor 12a is connected to the bit line 2a while the gate of the p-channel MOS transistor 14a is connected to a storage node 16a. The n-channel MOS transistor 12b and the p-channel MOS transistor 14b are connected in series between the power supply line 19 and another control terminal 17b. The gate of the n-channel MOS transistor 12b is connected to the inverted-bit line 2b while the gate of the p-channel MOS transistor 14b is connected to another storage node 16b. Furthermore, output gates 11a and 11b are constituted of p-channel MOS transistors. These transistors 11a and 11b are connected between the match line 3 and the control terminals 17a and 17b, respectively. Furthermore, the respective gates of these transistors 11a and 11b are connected to the output gate control line 4. A capacitance element 9a (capacitance value $C_S$) and another capacitance element 9b (capacitance value $C_S$) are connected to the control terminals 17a and 17b, respectively. Meanwhile, the match line 3 has parasitic capacitance (capacitance value $C_M$).

In the following, operation of the CAM cell 66 shown in FIG. 20 will be described for its matching operation only. The writing and reading operations thereof are performed substantially in the same manner as those of the conventional CAM cell 6' shown in FIG. 5.

Bit Matching Operation

In matching operation, first, the bit line 2a and the inverted-bit line 2b are both turned down to the "L" level to turn the N-channel MOS transistors 12a and 12b off. The output gate control line 4 is then turned down to the "L" level to turn on the output gates 11a and 11b constituted of the p-channel MOS transistors. Furthermore, the match line 3 is turned down to the "L" level $V_{SS}$) to discharge the control terminals 17a and 17b. Thereafter, the output gate control line 4 is raised to the "H" level thereby to turn the output gates 11a and 11b off again. Subsequently, retrieval data is applied to the bit line 2a and the inverted-bit line 2b. At this moment, if match is found between the storage data and the retrieval data, the control terminals 17a and 17b are both held at the "L" level. Conversely, if any mismatch exists, either of the 17a and 17b is charged by the power supply line 19. For example, assuming that an "H" level is stored in the storage node 16a and an "L" level in the storage 16b, the p-channel MOS transistor 14a is in its off-state while the p-channel MOS transistor 14b is in its on-state. At this moment, if an "H" level is applied to the bit line 2a and an "L" level to the inverted-bit line 2b, the n-channel MOS transistor 12a is turned on while the n-channel MOS transistor 12b is turned off so that the control terminals 17a and 17b are both held at the "L" level. If an "L" level is applied to the bit line 2a and an "H" level is applied to the inverted-bit line 2b, however, the n-channel MOS transistor 12a is turned off and the n-channel MOS transistor 12b is turned on so that the control terminal 17a is held at the "L" level while the control terminal 17b is charged to the "H" level by the power supply line 19 by way of the p-channel MOS transistor 14b and the n-channel MOS transistor 12b (mismatch). Furthermore, if the bit line 2a and the inverted-bit line are both held at the "L" level, both of the n-channel MOS transistors 12a and 12b are held in their off-state so that the control terminals 17a and 17b are also held at the "L" level (mask).

Now, an "L" level is applied to both of the bit line 2a and the inverted-bit line 2b again to turn the n-channel MOS transistors 12a and 12b off.

Subsequently, the match line 3 is precharged to the "L" level and an appropriate potential $V_{CL}$ is applied to the output gate control line 4, supposing that $V_{SS} < V_{CL} < V_{CC} - |V_{TH}|$ (where $V_{TH}$ represents threshold voltage of the p-channel MOS transistor 11). At this moment, if the control terminals 17a and 17b are both at the "H" level (or the comparison result above represents match), the output gates 11a and 11b are both held in their off-state. However, if either of the control terminals 17a and 17b is at the "H" level, either of the output gates 11a and 11b connected to these control terminals 17a and 17b, respectively, is turned on so that the control terminal 17a or 17b is discharged from the "H" level to $V_{CL} + |V_{TH}|$.

Therefore, potential level on the match line 3 changes according to the number of mismatched CAM cells 66 (or Hamming distance). This means that retrieval of storage data at any Hamming distance from retrieval data is possible if potential on the match line 3 corresponding to the Hamming distance to be retrieved is detected, for example, with a match detection circuit 200 of such a structure as shown in FIG. 13.

While in the foregoing six embodiments of the present invention have been described, the invention should not be limited only to these embodiment circuits, but many changes can be made in those circuits. For example, bipolar transistors may be used for the output gate 11 and data comparison portions 81 to 86. Furthermore, while retrieval data have been applied to the data comparison portions 81 to 86 through the bit line 2a and the inverted-bit line 2b, it may be also possible to provide other retrieval data dedicated lines besides the bit line 2a and the inverted-bit line 2b for applying retrieval data to the data comparison portions 81 to 86 therethrough. Additionally, while the respective data storage portions 71 to 76 have been adapted to store both data applied from the bit line 2a and the inverted-bit line 2b, they may be modified to store only either of those data and apply the storage data and its inverted data to the data comparison portions 81 to 86.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content-address memory cell which stores data and detects match or mismatch between the stored data and retrieval data to output the result on a match line, comprising:
   data storage means for storing the applied data;
   data comparison means for comparing the data stored in said data storage means with the applied retrieval data to output a comparison result as to whether match or mismatch is found between those data;
   capacitance element for storing the comparison result of said data comparison means;
   blocking means for blocking a part of a charge and discharge path for said capacitance element having stored the comparison result of said data comparison means; and
   charge transfer means for forming a charge and discharge path between the capacitance element and said match line to transfer a certain amount of charge from either one to the other when said capacitance element has stored mismatch of data as the comparison result of said data comparison means.

2. The content-address memory cell according to claim 1, wherein
   said blocking means comprises a unidirectional conducting element provided between output terminal of said data comparison means and said storage capacitance element.

3. The content-address memory cell according to claim 2, wherein
   said unidirectional conducting element comprises a diode which has the cathode connected to the output terminal of said data comparison means and the anode connected to said capacitance element.

4. The content-address memory cell according to claim 2, wherein said unidirectional conducting element is an MOS transistor which has the drain connected to the output terminal of said data comparison means and the gate and the source both connected to said capacitance element.

5. The content-address memory cell according to claim 1, wherein
   said blocking means comprises a switch element.

6. The content-address memory cell according to claim 5, wherein
   said switch elements is an MOS transistor which is provided between the output terminal of said data comparison means and said capacitance element, and responsive to a control signal applied to its gate through a switch element control line for operation.

7. The content-address memory cell according to claim 5, wherein
   said switch element is an MOS transistor provided in said data comparison means, said MOS transistor performing a first operation of transmitting predetermined logic to said capacitance element by being turned on or off in response to match/mismatch found between the data stored in said storage means and said retrieval data, and a second operation of blocking the charge and discharge path for said capacitance element by normally being in off-state.

8. The content-address memory cell according to claim 1, wherein
   said charge transfer means comprises an MOS transistor provided between said capacitance element and said match line.

9. The content-address memory cell according to claim 8, wherein
   said MOS transistor is controlled in conductivity by two kinds of constant voltages applied to its gate through the output gate control line.

10. The content-address memory cell according to claim 1, wherein
    the data to be stored and the retrieval data are applied to said data storage means and said data comparison means through a bit line and an inverted-bit line.

11. The content-address memory cell according to claim 1, wherein
    said data storage means stores said applied data when selected by a word line.

12. A content addressable semiconductor memory, comprising:
    an array of CAM cells arranged in a plurality of rows and columns,
    a plurality of word lines corresponding to said plurality of rows and being connected to the cells in corresponding rows,
    a plurality of match lines corresponding to said plurality of rows, the cells of each word being connected in common to a corresponding match line,
    a plurality of complementary bit line pairs corresponding to said plurality of columns and being connected to said cells in corresponding columns,
    selecting means for selecting any of said plurality of word lines,
    data inputting means for applying external data to said plurality of bit line pairs,
    data outputting means for reading data on said plurality of bit line pairs to the outside, and match result outputting means for outputting on said match lines an analog match result signal having a magnitude related to the number of cells connected in common to said match lines and storing a mismatch of data.

13. A method of determining a match of less than all memory cells of a content addressable memory comprising said cells arranged at locations wherein word lines cross with complementary bit line pairs and comprising data storage means for storing in selected cells data applied to said plurality of bit line pairs, means for reading data stored in selected cells to said plurality of bit line pairs, and match lines connected in common to all the cents of respective words, the method comprising the steps of:

applying retrieval data to be matched to all bit line pairs of said array;

comparing the data stored in the cells of each row with the applied retrieval data and applying a comparison result signal to a corresponding match line; and combining said comparison result signal with comparison result signals of other cells connected in common to said match line to provide an analog comparison signal having a magnitude related to the number cells storing mismatch data.

* * * * *